United States Patent
Nakata

(10) Patent No.: US 9,842,874 B2
(45) Date of Patent: Dec. 12, 2017

(54) SOLID STATE IMAGE SENSOR, METHOD OF MANUFACTURING THE SAME, AND ELECTRONIC DEVICE

(71) Applicant: SONY CORPORATION, Tokyo (JP)

(72) Inventor: Masashi Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 14/905,735

(22) PCT Filed: Jul. 17, 2014

(86) PCT No.: PCT/JP2014/003786
§ 371 (c)(1),
(2) Date: Jan. 15, 2016

(87) PCT Pub. No.: WO2015/011900
PCT Pub. Date: Jan. 29, 2015

(65) Prior Publication Data
US 2016/0172399 A1    Jun. 16, 2016

(30) Foreign Application Priority Data
Jul. 25, 2013 (JP) .................. 2013-154458

(51) Int. Cl.
*H01L 27/146* (2006.01)
*H04N 5/369* (2011.01)
*H04N 5/374* (2011.01)

(52) U.S. Cl.
CPC .... *H01L 27/14623* (2013.01); *H01L 27/1462* (2013.01); *H01L 27/1464* (2013.01);
(Continued)

(58) Field of Classification Search
CPC ......... H01L 27/14623; H01L 27/14621; H01L 27/1462; H01L 27/14605; H01L 27/14645;
(Continued)

(56) References Cited

U.S. PATENT DOCUMENTS

| 7,928,352 B2 * | 4/2011 | Toda ................. H01L 27/14603 250/208.1 |
| 2010/0176273 A1 * | 7/2010 | Shimoda ........... H01L 27/14623 250/208.1 |

(Continued)

FOREIGN PATENT DOCUMENTS

| JP | H06-140609 | 5/1994 |
| JP | 2003-007994 | 1/2003 |

(Continued)

OTHER PUBLICATIONS

Official Action (no English translation available) for Japanese Patent Application No. 2013-154458 dated Nov. 15, 2016. 19 pages.
(Continued)

*Primary Examiner* — Roy Potter
(74) *Attorney, Agent, or Firm* — Sheridan Ross P.C.

(57) ABSTRACT

A solid-state imaging device includes a phase detection photodiode, a light shielding film, and a light absorption film. The phase detection photodiode has a light receiving surface. The light shielding film covers a part of the light receiving surface of the phase detection photodiode. The light absorption film is disposed over the phase detection photodiode and over the light shielding film.

20 Claims, 24 Drawing Sheets

(52) U.S. Cl.
CPC .. *H01L 27/14605* (2013.01); *H01L 27/14621* (2013.01); *H01L 27/14625* (2013.01); *H01L 27/14634* (2013.01); *H01L 27/14641* (2013.01); *H01L 27/14645* (2013.01); *H01L 27/14685* (2013.01); *H04N 5/3696* (2013.01); *H04N 5/374* (2013.01)

(58) Field of Classification Search
CPC ......... H01L 27/14625; H01L 27/14641; H01L 27/14634; H01L 27/14685; H01L 27/1461; H01L 27/1464; H04N 5/374; H04N 5/369
See application file for complete search history.

(56) References Cited

U.S. PATENT DOCUMENTS

| | | | |
|---|---|---|---|
| 2010/0245637 A1* | 9/2010 | Itonaga | H01L 27/14621 348/273 |
| 2012/0033120 A1 | 2/2012 | Nakamura et al. | |
| 2016/0013233 A1* | 1/2016 | Noudo | H01L 27/14623 250/208.1 |

FOREIGN PATENT DOCUMENTS

| | | |
|---|---|---|
| JP | 2007-042933 | 2/2007 |
| JP | 2008-210904 | 9/2008 |
| JP | 2010-160313 | 7/2010 |
| JP | 2010-186818 | 8/2010 |
| JP | 2011-176715 | 9/2011 |
| JP | 2012-173492 | 9/2012 |
| WO | WO 2007/145373 A2 | 12/2007 |

OTHER PUBLICATIONS

Official Action (no English translation available) for Japanese Patent Application No. 2013-154458 dated Feb. 7, 2017, 21 pages.

International Search Report prepared by the European Patent Office dated Sep. 19, 2014, for International Application No. PCT/JP2014/003786.

Official Action (no. English translation available) for Japanese Patent Application No. 2013-154458 dated May 2, 2017, 4 pages.

* cited by examiner

FIG. 9
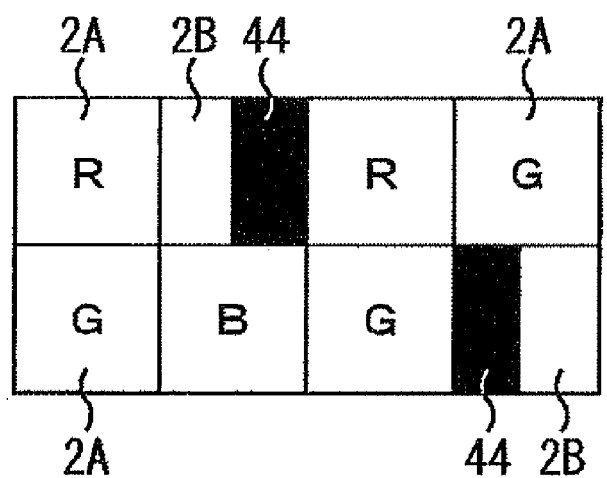
A
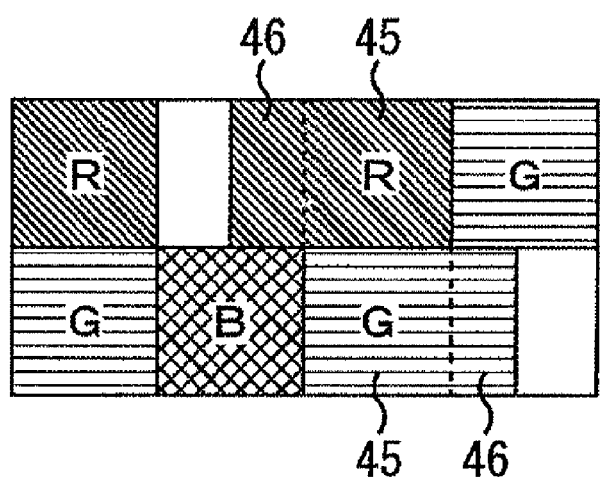
B

SOLID STATE IMAGE SENSOR, METHOD OF MANUFACTURING THE SAME, AND ELECTRONIC DEVICE

TECHNICAL FIELD

The present disclosure relates to a solid state image sensor, a method of manufacturing the same, and an electronic device, especially relates to a solid state imaging device, a method of manufacturing the same, and an electronic apparatus capable of suppressing unnecessary reflection at a phase detection pixel by a light shielding film.

CROSS-REFERENCE TO RELATED APPLICATIONS

This application is a national stage application under 35 U.S.C. 371 and claims the benefit of PCT Application No. PCT/JP2014/003786 having an international filing date of Jul. 17, 2014, which designated the United States, which PCT application claimed the benefit of Japanese Priority Patent Application JP 2013-154458 filed on Jul. 25, 2013, the disclosures of which are incorporated herein by reference in their entirety.

BACKGROUND ART

An electronic device in which a phase detection pixel is provided in a part of a plurality of pixels arranged in a two-dimensionally matrix manner has been developed (for example, PTL 1). In the phase detection pixel, a part of a light receiving region is shielded by a light shielding film, and lens focus deviation can be detected from a signal output from the phase detection pixel.

CITATION LIST

Patent Literature

PTL 1: JP 2010-160313 A

SUMMARY OF INVENTION

Technical Problem

However, when the light shielding film of the phase detection pixel is configured from a metal having a high reflectance, light shining on the light shielding film scatters, and may be mixed with an adjacent pixel, and may scatter into a lens barrel. As a result, a flare or a red-ball ghost may occur.

Further, when the scattering light is incident on a photodiode of the phase detection pixel, light that is originally intended to be shielded is photoelectrically converted, and thus the phase difference may be decreased. When the phase difference is decreased, AF control accuracy by the phase difference detection is decreased, and a focusing speed of the electronic device may be influenced.

The present disclosure overcomes the foregoing technical problem, and suppresses unnecessary reflection by a light shielding film in a phase detection pixel.

Solution to Problem

In a first aspect of the disclosure, a solid-state imaging device comprises a phase detection photodiode with a light receiving surface; a light shielding film that covers a part of the light receiving surface of the phase detection photodiode; and a light absorption film disposed over the phase detection photodiode, wherein, the light absorption film is disposed over the light shielding film.

In a second aspect of the disclosure, an electronic apparatus comprises: a solid-state imaging device including a first phase detection photodiode with a light receiving surface; a first light shielding film that covers a part of the light receiving surface; and a first light absorption film disposed over the first phase detection photodiode, wherein, the first light absorption film is disposed over the first light shielding film.

In a third aspect of the disclosure, a method of manufacturing a solid-state imaging device, said method comprising: forming a phase detection photodiode; forming a light shielding film to cover a part of a light receiving surface of the phase detection photodiode; and forming a light absorption film over the phase detection photodiode, wherein, the light absorption film is disposed over the light shielding film.

The solid state image sensor and the electronic device may be independent devices or may be a module incorporated in another device.

Advantageous Effects of Invention

According to first to third aspects of the present disclosure, unnecessary reflection by a light shielding film in a phase detection pixel can be suppressed.

BRIEF DESCRIPTION OF DRAWINGS

FIGS. 9A and 9B are diagrams describing a point to be paid attention in the sixth embodiment of a phase detection pixel.

DESCRIPTION OF EMBODIMENTS

Hereinafter, embodiments for implementing the present disclosure (hereinafter, referred to as embodiments) will be described. The description will be made in the following order.

1. A schematic configuration example of a solid state image sensor
2. A first embodiment of a phase detection pixel (a configuration including a light absorption film)
3. Second to fourth embodiments of a phase detection pixel (configurations including a light absorption film and a white filter)
4. Fifth and sixth embodiments of a phase detection pixel (configurations including adjacent color filters)
5. Seventh and ninth embodiments of a phase detection pixel (configurations including a light absorption film and a color filter)
6. An example of exit pupil correction of a solid state image sensor
7. An arrangement example of a light shielding film
8. An application example of an electronic device <1. A Schematic Configuration Example of a Solid State Image Sensor>

Figure 1:
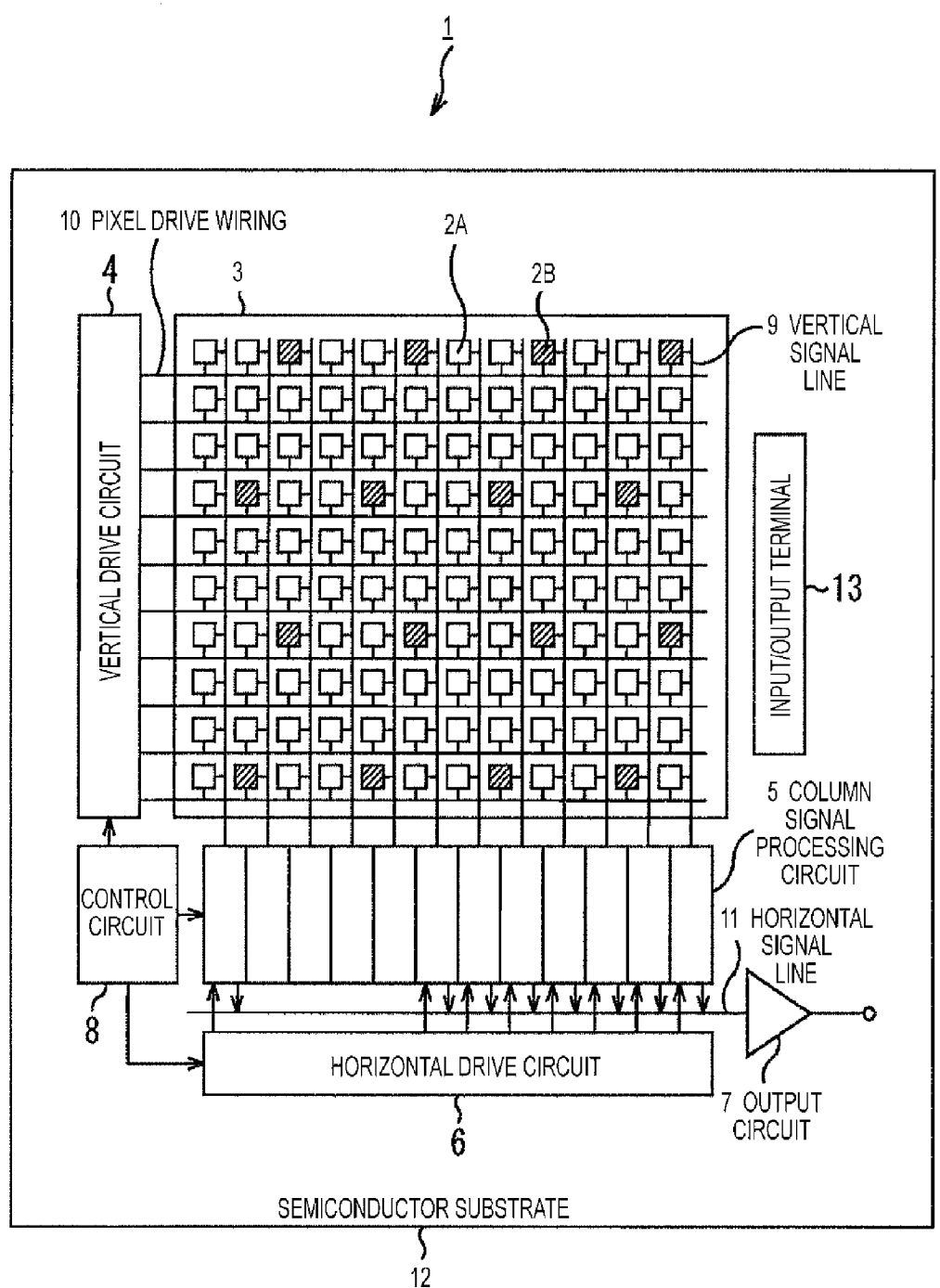
FIG. 1 is a diagram illustrating a schematic configuration of a solid state image sensor according to the present disclosure.

FIG. 1 is a schematic configuration of a solid state image sensor according to the present disclosure.

A solid state image sensor 1 of FIG. 1 includes a pixel array unit 3 in which pixels 2 are arranged in a two-dimensionally matrix manner and a peripheral circuit unit in a periphery of the pixel array unit 3 in a semiconductor substrate 12 using silicon (Si) as a semiconductor. A vertical drive circuit 4, a column signal processing circuit 5, a horizontal drive circuit 6, an output circuit 7, a control circuit 8, and the like are included in the peripheral circuit unit.

In the pixel array unit 3, the pixels 2 arranged in a two-dimensionally matrix manner include an imaging pixel 2A that generates a signal for image generation and a phase detection pixel 2B that generates a signal for focus detection. Differences between the imaging pixel 2A and the phase detection pixel 2B will be described below.

The pixel 2 includes a photodiode as a photoelectric conversion element, and a plurality of pixel transistors (e.g., so-called, a MOS transistor). The plurality of pixel transistors is configured from four MOS transistors including a transfer transistor, a selection transistor, a reset transistor, and an amplification transistor, for example.

Further, the pixel 2 can have a shared pixel structure. The pixel shared structure is configured from a plurality of photodiodes, a plurality of transfer transistors, one floating diffusion (floating diffusion region) to be shared, and two other pixel transistors to be shared. That is, in the shared pixel, the plurality of photodiodes and the plurality of transfer transistors that configure a plurality of unit pixels share two other pixel transistors.

The control circuit 8 receives an input clock and data that instructs an operation mode, and the like, and outputs data such as internal information of the solid state image sensor 1. That is, the control circuit 8 generates a clock signal that serves as a reference of an operation of a vertical drive circuit 4, a column signal processing circuit 5, and a horizontal drive circuit 6, and a control signal, based on a vertical synchronization signal, a horizontal synchronization signal, and a master clock. The control circuit 8 then outputs a generated clock signal or control signal to the vertical drive circuit 4, the column signal processing circuit 5, the horizontal drive circuit 6, and the like.

The vertical drive circuit 4 is configured from a shift register, for example. The vertical drive circuit 4 selects a pixel drive wire 10, supplies a pulse for driving the pixels 2 of the selected pixel drive wire 10, and drives the pixels 2 in row units. That is, the vertical drive circuit 4 sequentially selects and scans the pixels 2 in the pixel array unit 3 in a vertical direction in row units, and supplies a pixel signal based on a signal charge generated according to a received light amount in a photoelectric conversion unit of each pixel 2 to the column signal processing circuit 5 through a vertical signal line 9.

The column signal processing circuit 5 is arranged in each column of the pixels 2, and performs signal processing such as noise removal for each pixel column with respect to a signal output from the pixels 2 of one row. For example, the column signal processing circuit 5 performs signal processing such as correlated double sampling (CDS) for removing a fixed pattern noise unique to a pixel and AD conversion.

The horizontal drive circuit 6 is configured from a shift register, for example. The horizontal drive circuit 6 sequentially selects each of the column signal processing circuits 5 by sequentially outputting a horizontal scanning pulse, and outputs a pixel signal from each of the column signal processing circuits 5 to the horizontal signal line 11.

The output circuit 7 performs signal processing with respect to the signals sequentially supplied from the column signal processing circuits 5 through the horizontal signal line 11, and outputs a processed signal. The output circuit 7 may perform buffering only, for example, or may perform black level adjustment, column variation correction, and various types of digital signal processing. An input/output terminal 13 exchanges signals with an outside.

The solid state image sensor 1 configured as described above is a CMOS image sensor called column AD system in which the column signal processing circuits 5 that perform the CDS processing and the AD conversion processing are arranged for each pixel column.

<A Partially Enlarged Diagram of a Pixel Array Unit>

Figure 2:
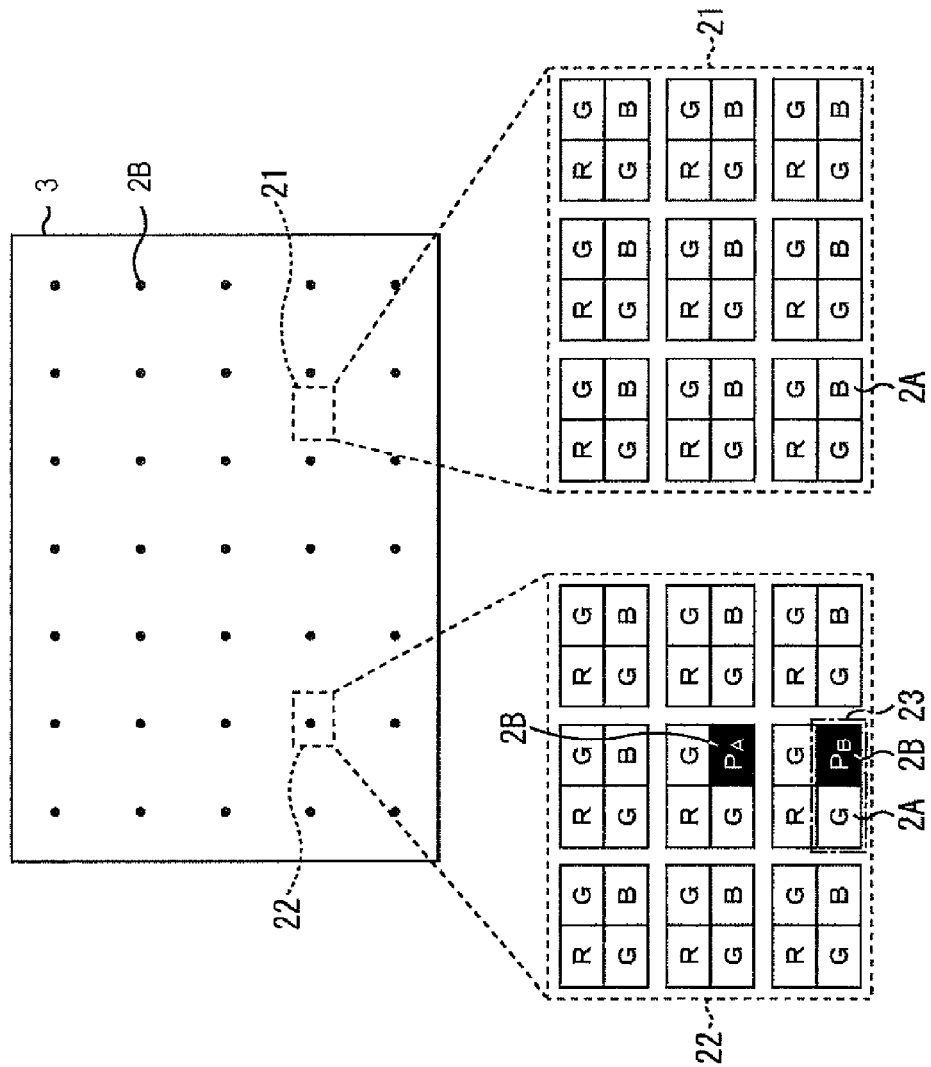
FIG. 2 is a diagram illustrating only a pixel array unit.

FIG. 2 is a diagram illustrating the pixel array unit 3 of FIG. 1.

In the pixel array unit 3 of FIG. 2, the phase detection pixel 2B is illustrated by a black circle. FIG. 2 illustrates, in the pixel array unit 3, enlarged diagrams of a region 21 in which only the imaging pixel 2A is arranged, and of a region 22 in which both of the imaging pixel 2A and the phase detection pixel 2B are arranged.

In the regions 21 and 22, characters "R", "G", and "B" illustrated in each imaging pixel 2A indicate colors of color filters formed in the pixel. To be specific, "R" represents red, "G" represents green, and "B" represents blue. Therefore, the color filters in each imaging pixel 2A of the pixel array unit 3 are arranged in a so-called Bayer array. Note that, hereinafter, the imaging pixel 2A in which the "R" color filter is arranged may be called R pixel, the imaging pixel 2A in which the "G" color filter is arranged may be called G pixel, and the imaging pixel 2A in which the "B" color filter is arranged may be called B pixel.

In the region 22, a part of the imaging pixel 2A in which the "B" color filter is arranged in the Bayer array is replaced with the phase detection pixel 2B.

There are two types for the phase detection pixel 2B, which include a type A in which a right-side half portion of a light receiving surface of the photodiode is shielded and a type B in which a left-side half portion is shielded where a shielding direction is a right and left direction (horizontal direction), for example. These two types make a pair, and are arranged in a predetermined position in the pixel array unit 3.

In the region 22 of FIG. 2, the phase detection pixel 2B of the type A is displayed as "$P_A$", and the phase detection pixel 2B of the type B is displayed as "$P_B$".

Between a pixel signal from the type A and a pixel signal from the type B, deviation of an image occurs due to a difference in formed positions of opening portions. From the deviation of an image, auto focus can be achieved by calculating a defocus amount by calculating a phase deviation amount, and adjusting (moving) an imaging lens.

<2. A First Embodiment of a Phase Detection Pixel>
<A Cross Sectional Configuration Diagram of a Pixel>

Figure 3:
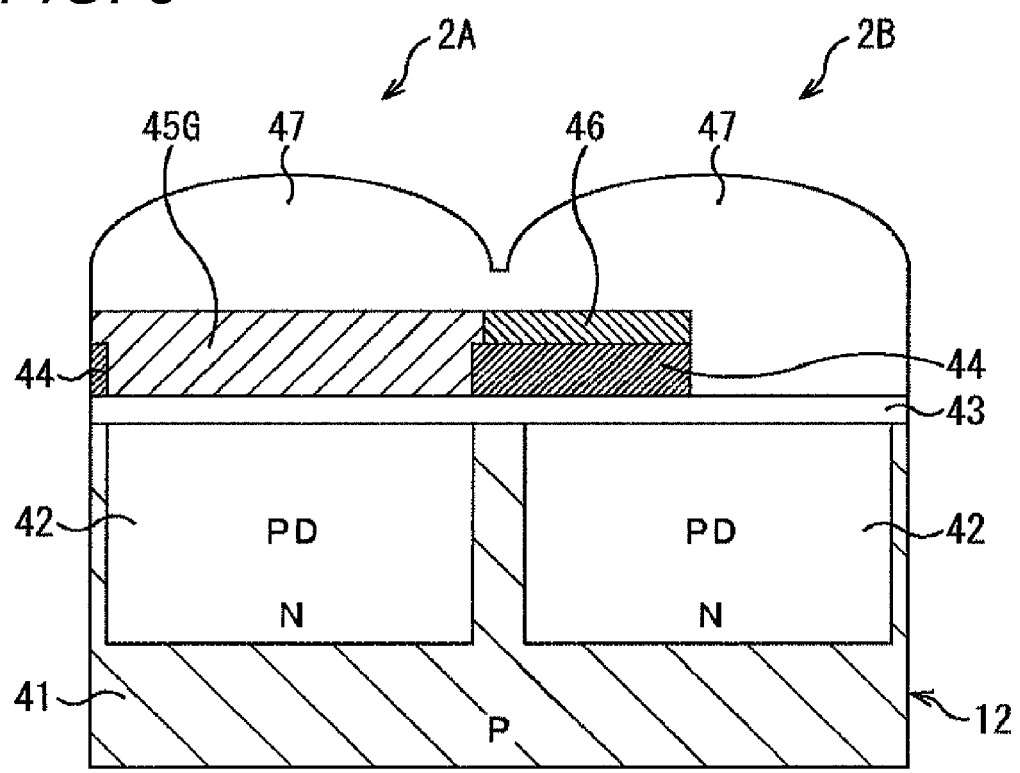
FIG. 3 is a cross sectional configuration diagram of an imaging pixel and a phase detection pixel.

A cross sectional configuration of the region 23 of FIG. 2 in which the imaging pixel 2A and the phase detection pixel 2B are adjacent to each other will be described with reference to FIG. 3. That is, FIG. 3 is a diagram illustrating a cross sectional configuration of the imaging pixel 2A and the phase detection pixel 2B of the solid state image sensor 1 of FIG. 1.

In the solid state image sensor 1, a photodiode PD is formed in pixel units by forming an N type (second conductive type) semiconductor region 42 on a P type (first conductive type) semiconductor region 41 of the semiconductor substrate 12 for each pixel 2.

A plurality of pixel transistors that reads charges accumulated in the photodiode PD and a multilayer wiring layer made of a plurality of wiring layers and an interlayer insulating film are formed on the semiconductor substrate 12 at a surface side (lower side in the drawing) (none of them is illustrated).

An antireflection film (insulating layer) 43 made of a silicon oxide film, or the like is formed in an interface of the semiconductor substrate 12 at a back surface side (an upper side in the drawing).

A light shielding film 44 is formed on a part of the antireflection film 43 at an upper side. To be specific, in the imaging pixel 2A, the light shielding film 44 is formed only on a pixel boundary on the antireflection film 43 such that light is incident on the entire surface of the photodiode PD. Meanwhile, in the phase detection pixel 2B, the light shielding film 44 is formed such that the light receiving surface of the photodiode PD is shielded larger than the imaging pixel 2A. That is, in the phase detection pixel 2B, the light shielding film 44 is formed such that a one side half portion (e.g., a left-side half portion of FIG. 3) of the light receiving surface of the photodiode PD is also shielded in addition to the pixel boundary. In this regard, the imaging pixel 2A has a light receiving region that is larger than that of the phase detection pixel 2B.

The light shielding film 44 may just be formed of a material that shields light, and is desirably formed of a material having high light shielding property and capable of being precisely processed by fine processing, for example, by etching. The light shielding film 44 can be formed of a metal film of tungsten (W), aluminum (Al), copper (Cu), titanium (Ti), molybdenum (Mo), nickel (Ni), or the like.

A color filter 45 is formed on the antireflection film 43 including the light shielding film 44 in the imaging pixel 2A. The color filter 45 is formed such that a photosensitive resin including a coloring matter such as a pigment or a dye is rotationally coated. In the region 23 of FIG. 2, the color filter 45 arranged in the imaging pixel 2A is a filter that transmits only green (G) light. Note that, in the following diagrams after FIG. 2, the green (G) color filter 45 is illustrated as a color filter 45G, the blue (B) color filter 45 is illustrated as color filter 45B. The red (R) color filter 45 is illustrated as a color filter 45R.

An on-chip lens (microlens) 47 is formed on the color filter 45. The on-chip lens 47 is formed of a resin material such as a styrene resin, an acrylic resin, a styrene-acrylic copolymer resin, or a siloxane resin.

Meanwhile, a light absorption film 46 is formed on an upper side of the light shielding film 44 in the phase detection pixel 2B. The light absorption film 46 can be formed of the same material as the color filter 45, for example, and as described with reference to FIG. 2, in the present embodiment, the phase detection pixel 2B is arranged in a position where the "B" color filter is arranged, and thus the light absorption film 46 is formed of the same material as the blue (B) color filter 45. Then, an on-chip lens 47 is formed on an upper side of the opening portion and the light absorption film 46 where the light shielding film 44 is not formed.

The imaging pixel 2A and the phase detection pixel 2B are configured as described above, and the solid state image sensor 1 is a back surface irradiation type CMOS solid state image sensor in which light is incident from a back surface side that is an opposite side to the surface side of the semiconductor substrate 12 on which the pixel transistor is formed.

Figure 4:
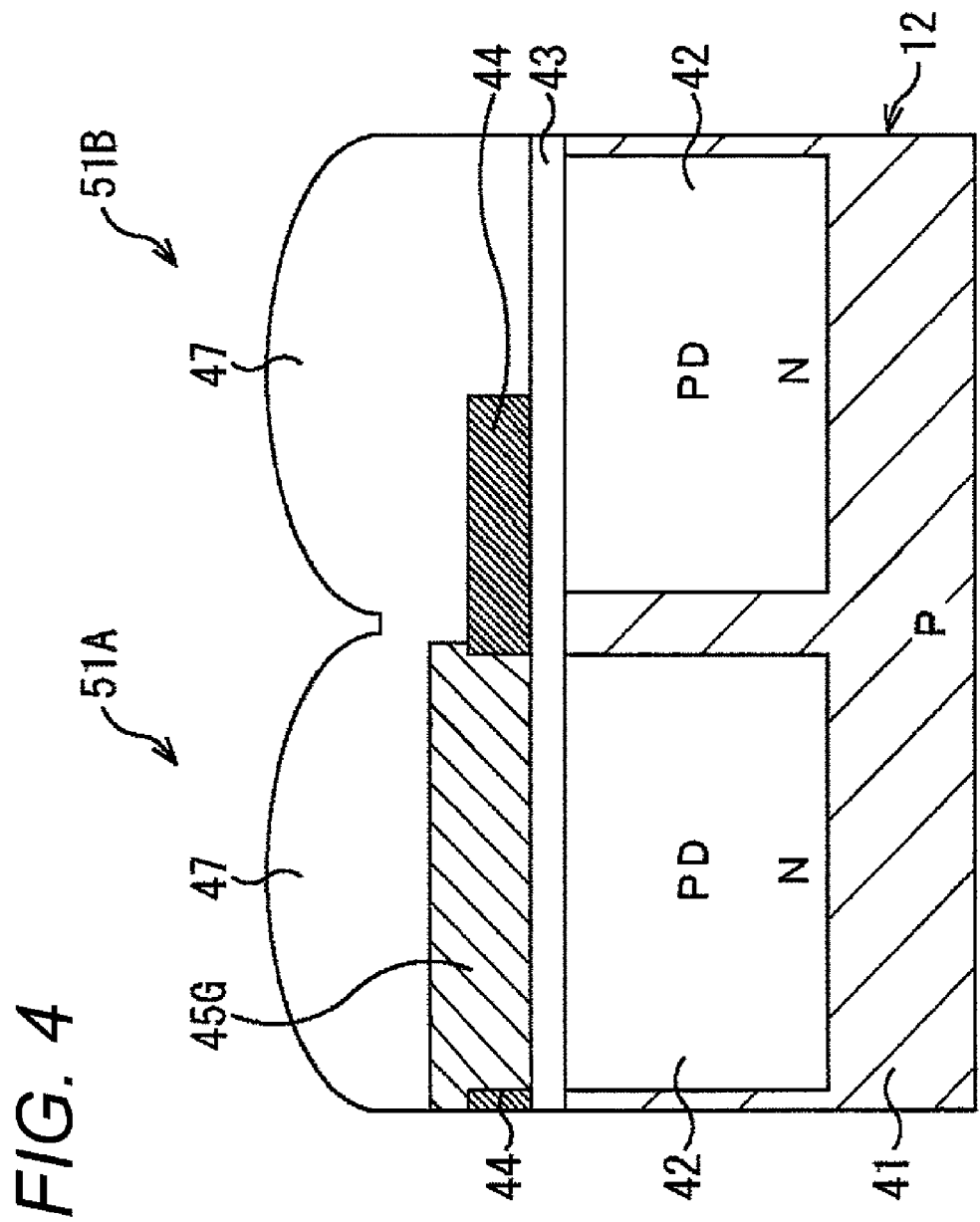
FIG. 4 is a cross sectional configuration diagram of a typical imaging pixel and phase detection pixel.

For reference, a structure of an imaging pixel 51A and a phase detection pixel 51B having a typical pixel structure is illustrated in FIG. 4. In the drawings after FIG. 4, portions corresponding to FIG. 3 are denoted with the same reference signs, and description will be given focusing on portions different from the pixel structure of FIG. 3.

The pixel structure of the imaging pixel 51A is the same as the pixel structure of the imaging pixel 2A of the solid state image sensor 1 described above.

In contrast, comparing the pixel structure of the phase detection pixel 51B with the pixel structure of the phase detection pixel 2B of the solid state image sensor 1 described above, the phase detection pixel 51B of FIG. 4 has a difference that the light absorption film 46 is not formed on the upper side of the light shielding film 44.

Differences between the pixel structure of the phase detection pixel 2B in the solid state image sensor 1 and the pixel structure of the typical phase detection pixel 51B will be described further with reference to FIGS. 5A and 5B.

Figure 5:
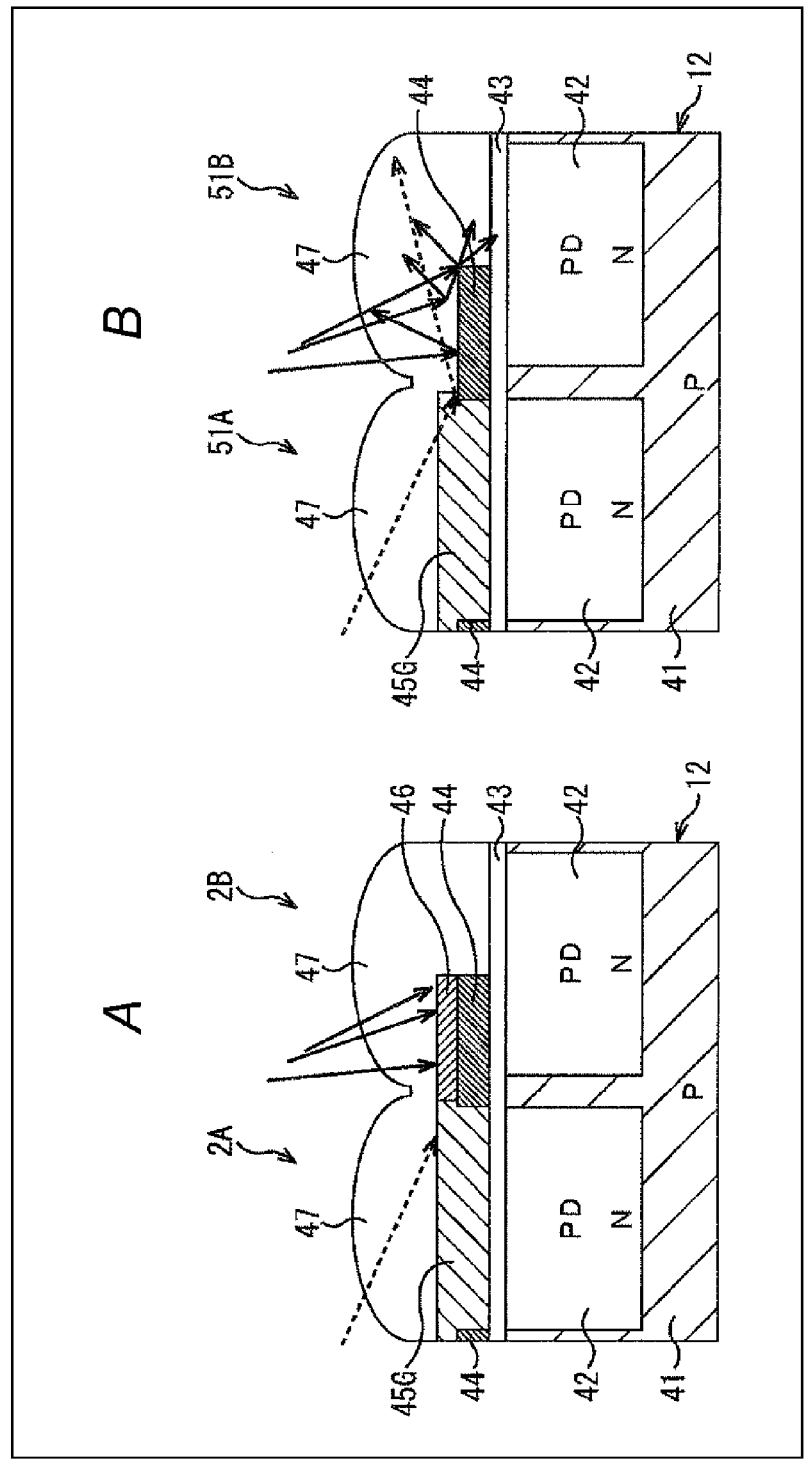
FIGS. 5A and 5B are diagrams describing a difference between a pixel structure of the phase detection pixel of FIG. 1 and a typical pixel structure.

FIG. 5A illustrates a pixel structure of the solid state image sensor 1 illustrated in FIG. 3, and FIG. 5B illustrates the typical pixel structure illustrated in FIG. 4.

In the typical phase detection pixel 51B illustrated in FIG. 5B, the light absorption film 46 is not formed on the upper side of the light shielding film 44, and thus the light having a large light amount incident on the phase detection pixel 51B irradiates the light shielding film 44 as it is. The light shielding film 44 is typically formed of a metal film, and has a high reflectance. Thus, as illustrated in FIG. 5B, the light having a large light amount scatters, and is incident on the adjacent imaging pixel 51A, and may sometimes be a cause of color mixture.

Further, the light shining on the light shielding film 44 that is originally intended to be shielded may sometimes be incident on the photodiode PD of the phase detection pixel 51B. In this case, the light that is originally intended to be shielded is phoeoelectrically converted, and thus an error occurs in the phase difference signal, and the accuracy of AF control by the phase difference detection is decreased.

Further, the light shining on the light shielding film 44 may scatter outside the on-chip lens 47. When the light shining on the light shielding film 44 scatters outside the on-chip lens 47, the light having scattered outside the on-chip lens 47 is reflected at an IR cut filter of an optical system that exists further outside the on-chip lens 47, and is incident on the photodiode PD again, so that a flare or a red-ball ghost may occur.

Note that, in the typical phase detection pixel 51B, there may be a case in which a transparent (white) color filter 45 is formed, other than the case where one corresponding to the color filter 45 is not formed. Even in this case, the transparent color filter 45 does not reduce the light, and thus a similar state to the above occurs.

In contrast, in the phase detection pixel 2B of the solid state image sensor 1, the light absorption film 46 is formed on the light shielding film 44, and thus the incident light to be shielded is absorbed, and the light amount of the light shining on the light shielding film 44 is decreased. Accordingly, even if the light shielding film 44 is configured from a metal film having a high reflectance, scattering of the light shining on the light shielding film 44, occurrence of color mixture in an adjacent pixel and scattering of light in the lens barrel can be suppressed, and occurrence of a flare or a red-ball ghost can be decreased.

Further, when the light that has shined on the light shielding film 44 and has scattered is incident on the photodiode PD of the phase detection pixel 2B, risks that the light originally intended to be shielded is photoelectrically converted and the phase difference is decreased can be decreased, and thus the AF control accuracy or the focusing speed can be improved.

The light absorption film 46 is formed of a material having a larger effect to absorb light than the antireflection film. Therefore, while there is a risk that light propagates in an adjacent pixel or the phase detection pixel itself even if reflection can be prevented in the antireflection film, the risk can be decreased in the light absorption film 46.

The phase detection pixel 2B is arranged in the pixel position where the blue (B) color filter 45 is arranged if the pixel is the imaging pixel 2A, and the light absorption film 46 is formed of the same material as the blue color filter 45.

The light absorption film 46 formed of a blue color filter material can decrease more light than a green color filter material, for example. Further, the light having scattered outside the on-chip lens 47 is more easily reflected by an IR cut filter that is outside the on-chip lens 47 and the like, and incident on the photodiode PD again. However, the blue light is at a low risk. That is, the light having scattered outside the on-chip lens 47 is less easily incident on the photodiode PD again.

From the above merits, the phase detection pixel 2B is positioned at the pixel position of the blue color filter 45 of the Bayer array, and the light absorption film 46 is formed of the same material as the blue color filter 45.

Note that the phase detection pixel 2B may be arranged in the pixel position where the green or red color filter 45 is arranged if the pixel is the imaging pixel 2A, and the light absorption film 46 may be formed of the green or red color filter material.

Further, the light absorption film 46 may be formed of a photosensitive resin material (black color filter) including, for example, a black pigment or dye other than green, red, and blue or an infrared filter. Note that, if the light absorption film 46 is formed of a material different from the color filter 45 used in the imaging pixel 2A, the number of manufacturing processes is increased and thus an increase in cost needs to be paid attention.

<A Method of Manufacturing a Pixel>

Next, a method of manufacturing the imaging pixel 2A and the phase detection pixel 2B will be described with reference to FIGS. 6A to 6F.

Note that, in FIGS. 6A to 6F, illustration of the multilayer wiring layer at the surface side of the semiconductor substrate 12 on which the photodiode PD is formed is omitted for ease of illustration and explanation purposes, but the multilayer wiring layer may be present.

Figure 6:
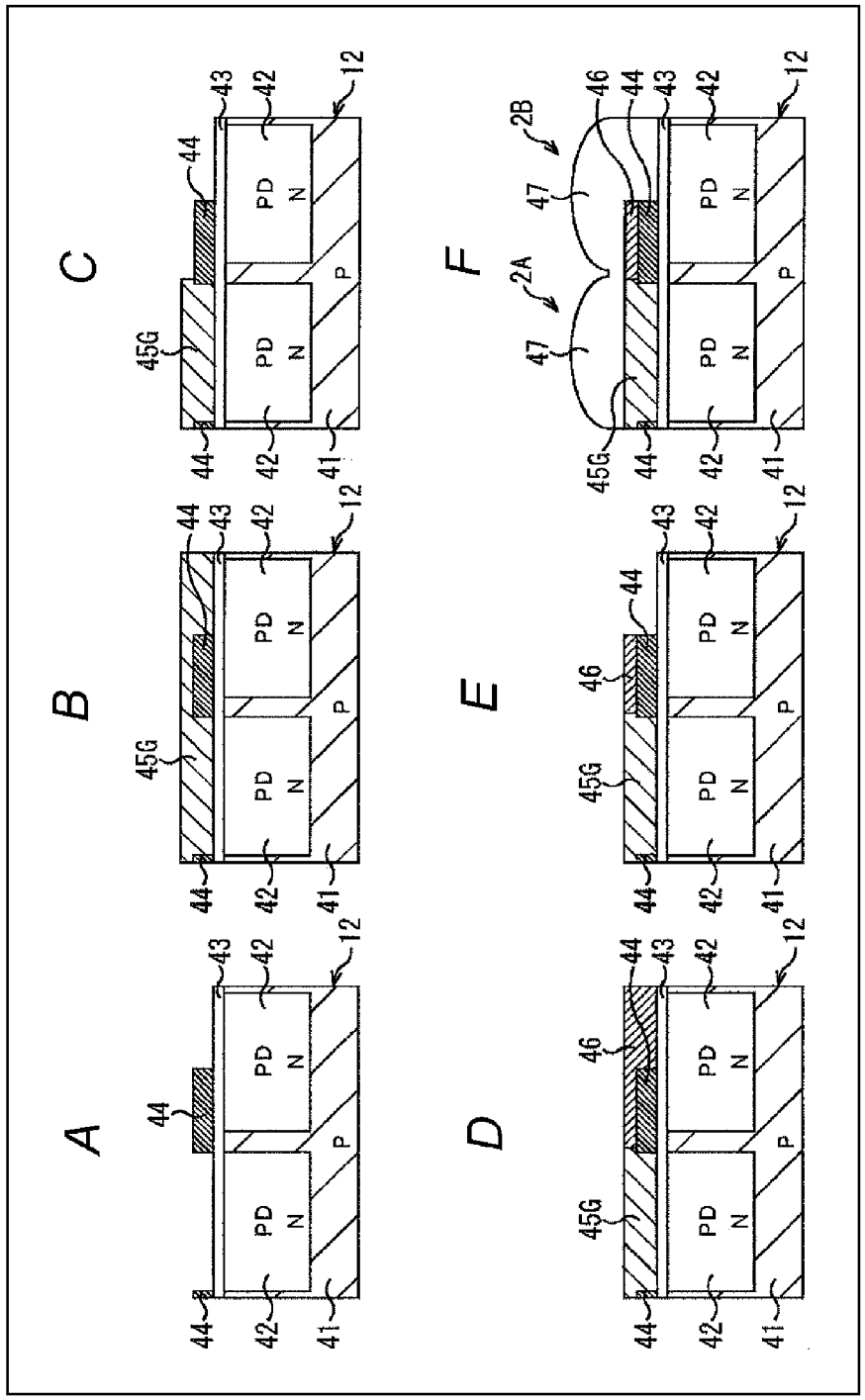
FIGS. 6A to 6F are diagrams describing a method of manufacturing an imaging pixel and a phase detection pixel.

First, as illustrated in FIG. 6A, the antireflection film 43 and the light shielding film 44 are formed on the back surface side of the semiconductor substrate 12 in order.

Then, assume that the color filters 45 of the imaging pixels 2A are formed in the order of green (G), blue (B), and red (R). First, as illustrated in FIG. 6B, the green color filter 45G is formed on the entire surface of the upper side of the antireflection film 43 and the light shielding film 44.

Then, a resist (not illustrated) is patterned on only a region that is to be a G pixel by lithography, so that the green color filter 45G other than the imaging pixel 2A that is to be the G pixel is removed, as illustrated in FIG. 6C.

Next, the blue color filter (not illustrated) is formed on the entire surface of the upper side of the antireflection film 43 and the light shielding film 44 of the imaging pixel 2A that is to be a B pixel. Accordingly, as illustrated in FIG. 6D, the blue color filter as the light absorption film 46 is also formed on the entire surface of the upper side of the antireflection film 43 and the light shielding film 44 of the phase detection pixel 2B. Then, as illustrated in FIG. 6E, the light absorption film 46 other than an upper portion of the light shielding film 44 of the phase detection pixel 2B is patterned by lithography.

Similarly, the red color filter (not illustrated) is formed on the entire surface of the upper side of the antireflection film 43 and the light shielding film 44 of the imaging pixel 2A that is to be an R pixel.

Finally, as illustrated in FIG. 6F, the on-chip lens 47 is formed on both of the imaging pixel 2A and the phase detection pixel 2B. The on-chip lens 47 can be formed such that a photosensitive resin material is subjected to pattern processing by lithography, and is transformed into a lens shape by reflow treatment.

According to the manufacturing method, in the process of forming the blue color filter 45 on the imaging pixel 2A that is to be the B pixel, the light absorption film 46 of the phase detection pixel 2B can be formed at the same time. Therefore, the light absorption film 46 can be formed without increasing the number of processes.

<3. Second to Fourth Embodiments of a Phase Detection Pixel>

Other embodiments of a phase detection pixel 2B will be described.

A transparent color filter (hereinafter, referred to as white filter) may be formed as a layer in a phase detection pixel 2B, the layer corresponding to a color filter 45 of an imaging pixel 2A.

Figure 7:
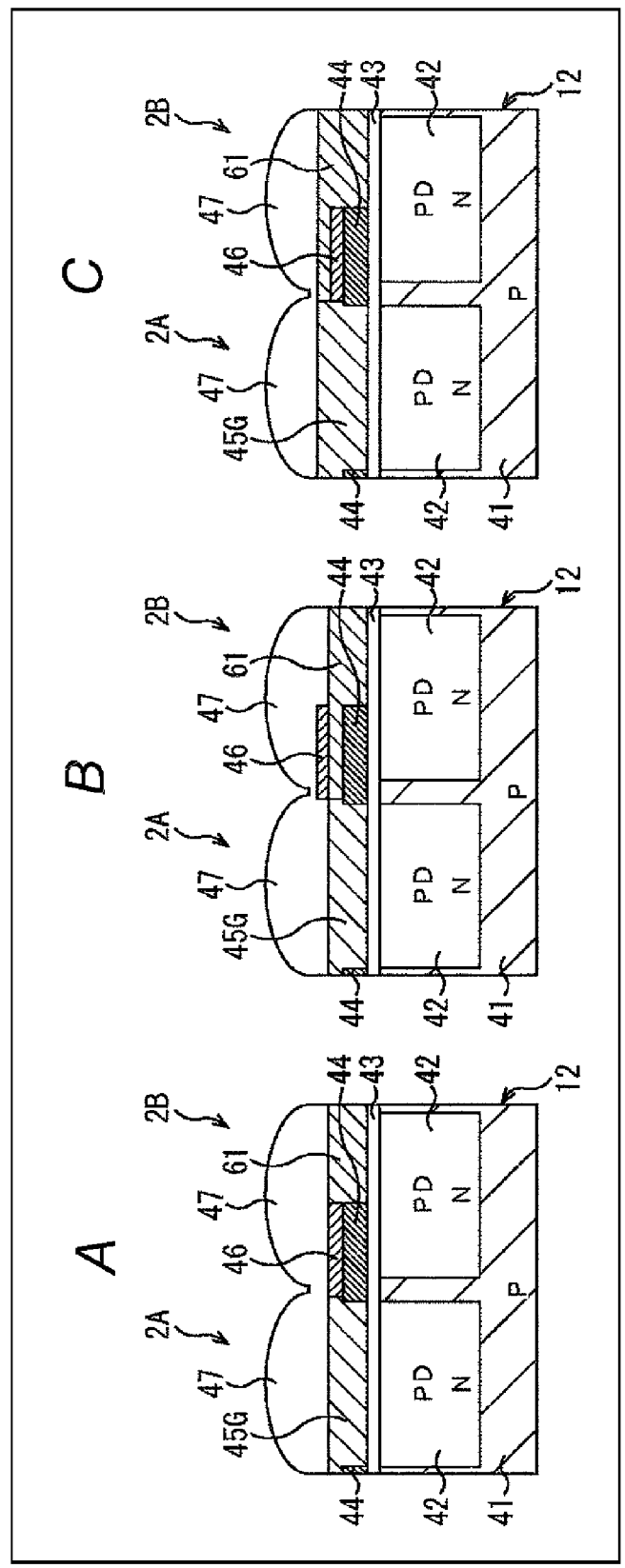
FIGS. 7A to 7C are diagrams illustrating second to fourth embodiments of a phase detection pixel.

Therefore, FIGS. 7A to 7C illustrate arrangement examples of a light absorption film 46 when the white filter is formed.

FIGS. 7A to 7C illustrate second to fourth embodiments of the phase detection pixel 2B where the pixel structure of the phase detection pixel 2B illustrated in FIG. 3 is called the first embodiment of the phase detection pixel 2B.

In the second embodiment illustrated in FIG. 7A, a white filter 61 is formed on a portion where a light absorption film 46 is not formed, the portion being a part of a portion of the phase detection pixel 2B that becomes the same layer as the color filter 45 of the imaging pixel 2A.

In the third embodiment illustrated in FIG. 7B, the white filter 61 is formed on a portion of the phase detection pixel 2B that becomes the same layer as the color filter 45 of the imaging pixel 2A, and the light absorption film 46 is formed on an upper surface of the white filter 61 of a portion where the white filter 61 and the light shielding film 44 are layered.

In the fourth embodiment illustrated in FIG. 7C, the light absorption film 46 and the white filter 61 are formed on a portion of the phase detection pixel 2B that becomes the same layer as the color filter 45 of the imaging pixel 2A. Here, the light absorption film 46 is formed to cover the upper surface of the light shielding film 44, and the white filter 61 is formed to cover the light absorption film 46.

<4. Fifth to Sixth Embodiments of a Phase Detection Pixel>

Figure 8:
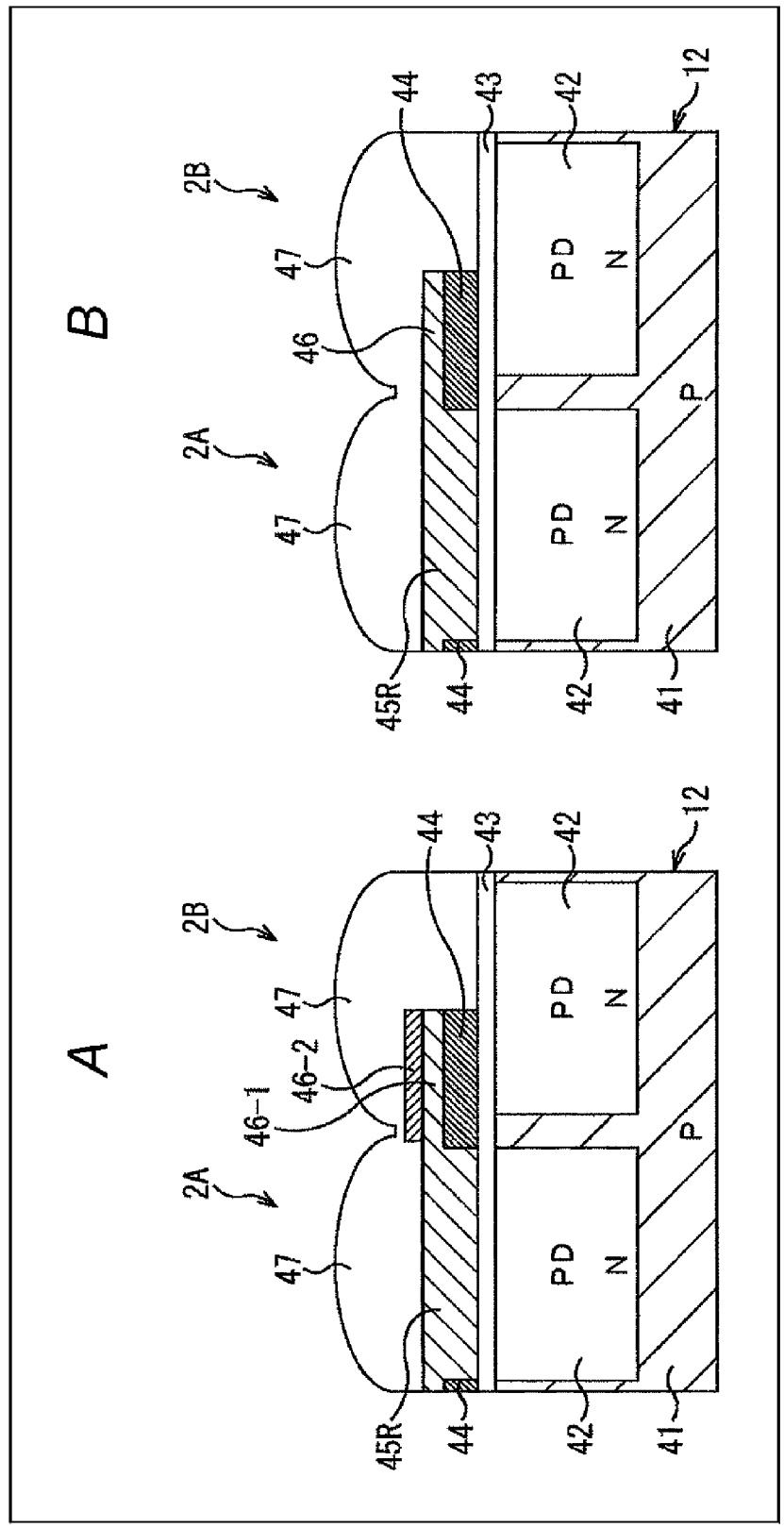
FIGS. 8A and 8B are diagrams illustrating fifth and sixth embodiments of a phase detection pixel.

FIGS. 8A and 8B illustrate fifth and sixth embodiments of a phase detection pixel 2B.

A phase detection pixel 2B of FIG. 8A illustrates an example in which a color filter 45 disposed over an adjacent imaging pixel 2A is also disposed over a light shielding film 44 of the phase detection pixel 2B to form a first light absorption film 46-1, and a color filter different from the first light absorption film 46-1 is layered on the first light absorption film 46-1 as a second light absorption film 46-2. By layering a plurality of color filters as the light absorption film 46, reflection of light by the light shielding film 44 can be substantially decreased.

Note that, as for a combination of colors of when a plurality of color filters is layered as the light absorption film 46, although depending on the film thickness, light of almost all of the wavelength range can be absorbed if the combination is red and blue. Therefore, for example, the first light absorption film 46-1 can be the red color filter, and the second light absorption film 46-2 thereon can be the blue color filter. However, other color combinations can be applicable. If at least one of the color filters 45 of an adjacent imaging pixel 2A is provided as a light absorption film 46 of phase detection pixel 2B, the solid state image sensor can be formed without increasing the number of processes in the manufacturing of the solid state imaging sensor.

Further, as illustrated in FIG. 8B, the color filter 45 provided over the adjacent imaging pixel 2A is also provided over the light shielding film 44 of the phase detection pixel 2B, and the light absorption film 46 may be formed by one layer.

Like the first embodiment illustrated in FIG. 3, there is a merit that fine processing of the color filter can be avoided in the structure in which the color filter 45 of the adjacent imaging pixel 2A is also provided over the phase detection pixel to serve as the light absorption film 46 of the phase detection pixel 2B, rather than the case in which the color filter 45 of the adjacent imaging pixel 2A and the light absorption film 46 of the phase detection pixel 2B are formed by color filter with different colors.

To be specific, in the first embodiment illustrated in FIG. 3, it is necessary to form the light absorption film 46 with a width of about 0.7 μm, where the pixel size of the phase detection pixel 2B (pixel width) is 1.4 μm, and the light receiving surface of the photodiode PD is shielded by ½ in the phase detection pixel 2B. If the color filter 45 is formed with a large size, variation at the manufacturing can be suppressed and the color filter 45 can be stably manufactured. Further, in a case of an isolated pattern with a small size of the color filter, a risk of peeling is increased.

Therefore, as illustrated in FIG. 8B, the color filter 45 of the adjacent imaging pixel 2A is also formed in the phase detection pixel 2B to serve as the light absorption film 46 in the phase detection pixel 2B, whereby the variation at the manufacturing can be suppressed and the peeling risk can be decreased, and especially, it is effective when the pixels are micronized.

Note that the following points need to be paid attention when the color filter 45 of the adjacent imaging pixel 2A is also provided as the light absorption film 46 in the phase detection pixel 2B.

The phase detection pixels 2B are arranged in the pixel array unit 3 as a pair of a type A in which a right-side half portion is shielded, and a type B in which a left-side half portion is shielded. If the colors of the color filters 45 disposed over the pair of phase detection pixels 2B as light absorption films 46 are different, a demerit occurs.

FIGS. 9A and 9B illustrate arrangement examples to be paid attention when the color filter 45 of the adjacent imaging pixel 2A is stretched and the light absorption film 46 is formed.

For example, as illustrated in FIG. 9A, assume a case in which the phase detection pixel 2B of the type A in which a right-side half portion covered by the light shielding film 44 is arranged between R pixels, and the phase detection pixel 2B of the type B in which a left-side half portion covered by the light shielding film 44 is arranged between G pixels.

In this case, as illustrated in FIG. 9B, the light absorption film 46 of the phase detection pixel 2B adjacent to the R imaging pixel comprises the same layer as the color filter 45 of the right adjacent R imaging pixel. Further, the light absorption film 46 of the phase detection pixel 2B adjacent to the G imaging pixel comprises the same layer as the color filter 45 of the left adjacent G imaging pixel.

Therefore, the light absorption film 46 of one of the pair of phase detection pixels 2B is formed of a red color filter, and the light absorption film 46 of the other phase detection pixel 2B of the pair is formed of a green color filter. Therefore, the colors of the color filters that are provided over the pair of phase detection pixels 2B are different.

Figure 10:
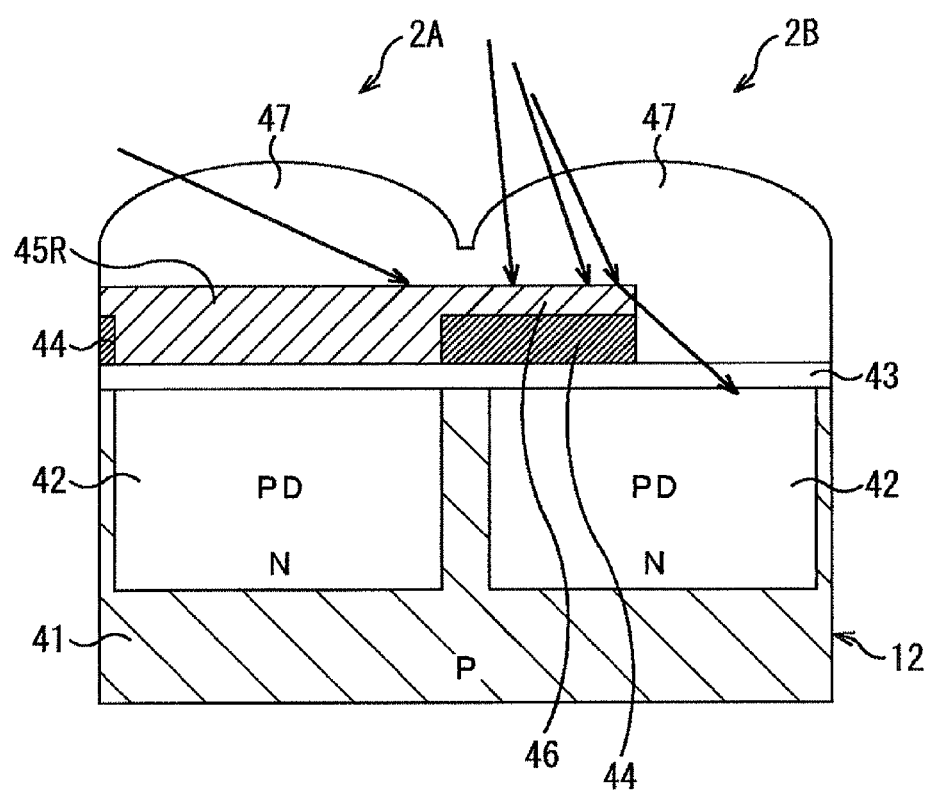
FIG. 10 is a diagram describing a point to be paid attention in the sixth embodiment of a phase detection pixel.

If the light incident on the light absorption film 46 that covers the light shielding film 44 does not enter the photodiode PD of the phase detection pixel 2B at all, there is no problem. However, in reality, as illustrated in FIG. 10, a part of the light incident on the light absorption film 46 may be incident on the photodiode PD of the phase detection pixel 2B. In that case, if the colors of the color filters comprising the light absorption films 46 are different in the pair of phase detection pixels 2B, a difference may be caused in the phase difference characteristic.

Figure 11:
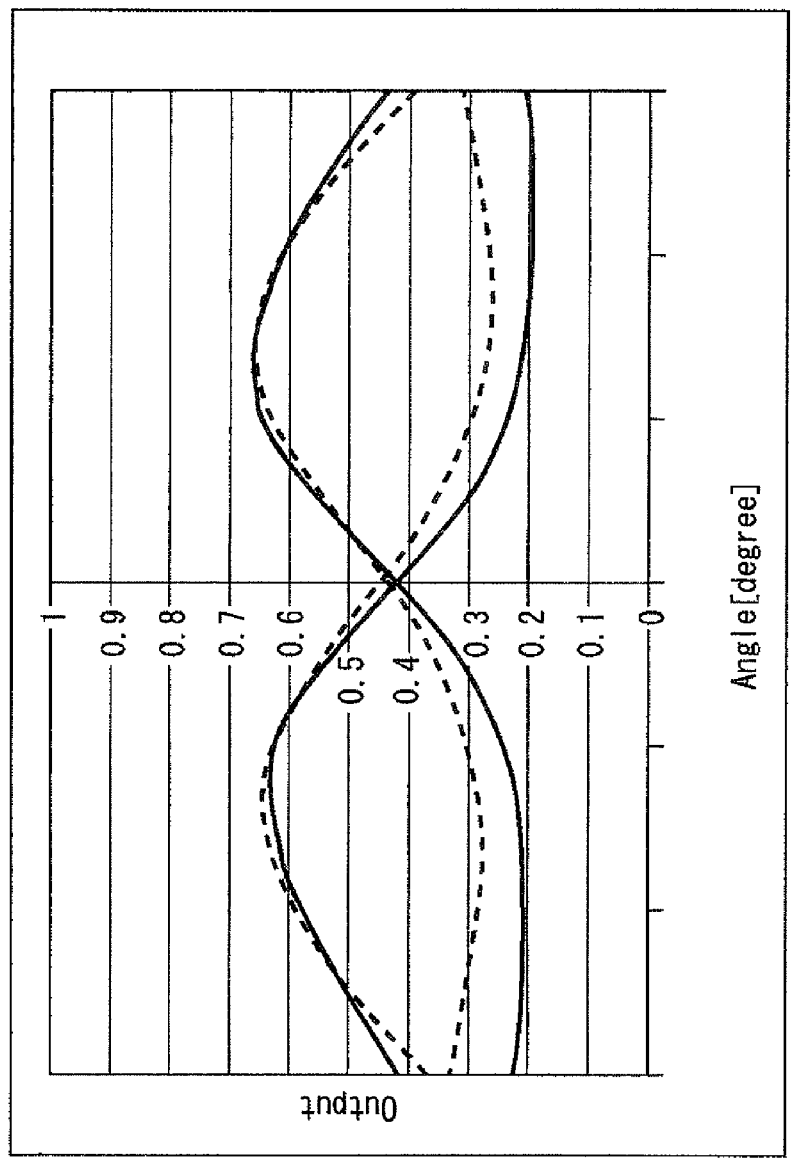
FIG. 11 is a diagram describing a point to be paid attention in the sixth embodiment of a phase detection pixel.

FIG. 11 illustrates a graph of comparison of signal outputs with respect to incident angles of light, where color filters with different colors are used for the light absorption films 46 of the phase detection pixels 2B.

The horizontal axis of FIG. 11 represents an incident angle of light with respect to the phase detection pixel 2B, and the vertical axis represents a signal output. In FIG. 11, the difference of colors of the color filter used as the light absorption film 46 is indicated by the solid line and the broken line. For example, the solid line indicates an example in which a red color filter is used as the light absorption film 46 and the dashed line indicates a case in which a blue color filter is used as the light absorption film 46.

In the examples of FIG. 11, when the color filters with different colors are used as the light absorption films 46, the characteristics are different as indicated by the solid line and the dashed line, and the color mixture of the phase detection pixel 2B indicated by the dashed line becomes larger.

As described above, when the color filter 45 of an adjacent imaging pixel 2A is also provided as the light absorption film 46 of the phase detection pixel 2B, the arrangement illustrated in FIGS. 9A and 9B in which color filters with different colors are used as the light absorption films 46 in a pair of phase detection pixels 2B is not favorable because the arrangement may cause a difference in the phase difference characteristic.

Therefore, it is favorable to unify the colors of the color filters used as the light absorption film 46 in the pair of the phase detection pixels 2B. For example, as illustrated in FIG. 2, it is favorable to arrange the pair of the phase detection pixels 2B in the positions where the color filter 45 of the adjacent imaging pixels 2A are the same color.

<An Overlapping Amount Between a Light Shielding Film and a Light Absorption Film>

Figure 12:
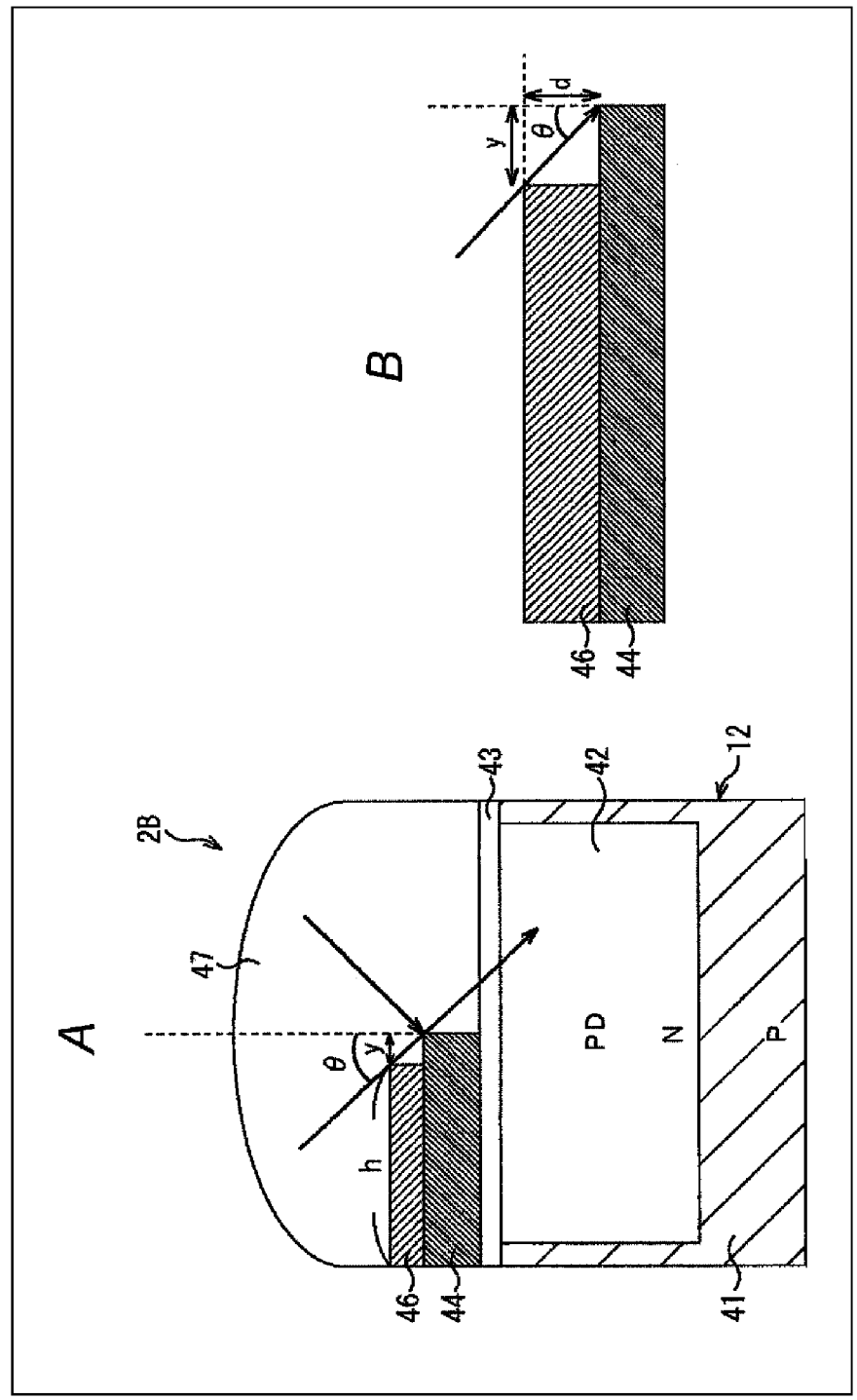
FIGS. 12A and 12B are diagrams describing an overlapping amount between a light shielding film and a light absorption film.

Next, an overlapping amount between the light shielding film 44 and the light absorption film 46 formed on the upper surface of the light shielding film 44 will be examined with reference to FIGS. 12A and 12B.

While the light incident on the light shielding film 44 should be reliably absorbed in the light absorption film 46, it is desirable for the light incident on the photodiode PD not to shine on the light absorption film 46. This is because, if the light incident on the photodiode PD shines on the light absorption film 46, the light is reduced.

Therefore, as illustrated in FIG. 12A, it is desirable that the overlapping amount between the light shielding film 44 and the light absorption film 46 is offset such that the line width h of the light absorption film 46 in the light shielding direction is shorter than the light shielding film 44. Here, an optimum value of an offset amount y from an end surface of the light shielding film 44 to an end surface of the light absorption film 46 in the light shielding direction will be examined.

FIG. 12B is an enlarged diagram of the light shielding film 44 and the light absorption film 46 of FIG. 12A.

Here, the on-chip lens 47 is designed such that an upper end of the light shielding film 44 is focused, and the offset amount y can be expressed by $y = d \cdot \tan \theta$, where a maximum value (maximum incident angle) of an incident angle of light with respect to the phase detection pixel 2B, which is determined according to the F value or a refractive index of an optical lens arranged in front of the solid state image sensor 1, is $\theta$,
and the height (thickness) of the light absorption film 46 is d.

Therefore, for example, when the maximum incident angle
$\theta = 40$ degrees
and the height of the light absorption film 46 d=100 nm, the offset amount y is 84 nm. Further, for example, when the maximum incident angle
$\theta = 8$ degrees
and the height of the light absorption film 46 d=100 nm, the offset amount y is 14 nm. In this way, the offset amount y differs largely according to
the maximum incident angle $\theta$.
Further,
the maximum incident angle $\theta$
differs in a central portion and in an outer peripheral portion of the pixel array unit 3, which are angles of view. Here, in the pixel array unit 3, assume that
the maximum incident angle $\theta$
of the central portion of the angle of view that is a position of 0 percent in height is 8 degrees, and
the maximum incident angle $\theta$
of the outer peripheral portion of the angle of view that is a position of 100 percent in height is 40 degrees. In this case, the offset amount y may be changed at the pixel position of the phase detection pixels 2B in the pixel array unit 3 by gradually increasing the offset amount y (decreasing the line width h) as the view of angle goes to the outer periphery of the angle of view such that the offset amount y of the phase detection pixel 2B of the central portion of the view of angle becomes 14 nm, and the offset amount y of the phase detection pixel 2B of the outer peripheral portion of the angle of view becomes 84 nm.

Further, even the phase detection pixel 2B of the type A in which the right-side half portion is shielded, or of the type B in which the left-side half portion is shielded, an optimum design can be individually conducted by changing the offset amount y.

Further, the offset amount y may be designed in consideration of accuracy of misalignment deviation of the lithography process.

<Modifications of the Fifth and Sixth Embodiments>

Figure 13:
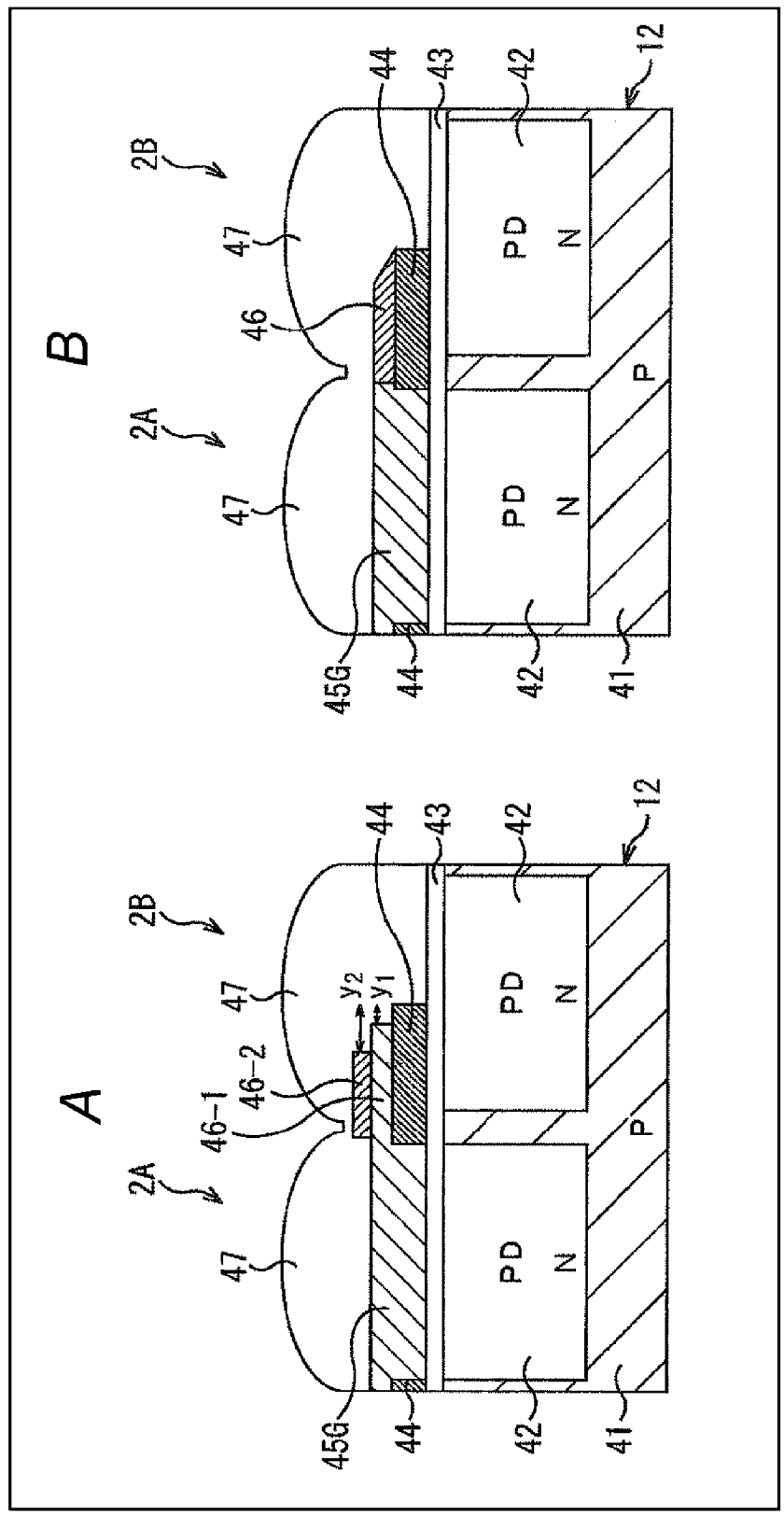
FIGS. 13A and 13B are diagrams illustrating modifications of the phase detection pixel of the fifth and sixth embodiments.

FIGS. 13A and 13B illustrate modifications of the fifth and sixth embodiments of the phase detection pixels 2B illustrated in FIGS. 8A and 8B.

FIG. 13A illustrates an example in which the offset amount y is adjusted with respect to the fifth embodiment illustrated in FIG. 8A.

As described above, an optimum offset amount y varies depending on the height d of the light absorption film 46. As illustrated in FIG. 8A, when the first light absorption film 46-1 and the second light absorption film 46-2 are layered, the space $y_1$ of the lower first light absorption film 46-1 and the space $y_2$ of the upper second light absorption film 46-2 have different optimum values. Therefore, as illustrated in FIG. 13A, the space y can be formed to be larger (the line width h can be formed to be smaller) for a layer closer to the on-chip lens 47.

FIG. 13B illustrates an example in which the offset amount y is adjusted with respect to the sixth embodiment illustrated in FIG. 8B.

In FIG. 13B, the light absorption film 46 is formed into a tapered (slope) shape such that a position closer to the on-chip lens 47 can have a broader space y (a smaller line width h). Such a shape can be formed such that a color filter as the light absorption film 46 is formed on the light shielding film 44, and is then subjected to reflow at a high temperature of
200°
or more.

Note that, when a high temperature of certain degrees or more is applied to the color filter, the characteristic of the color filter is changed, and the color filter may not function as a color filter. However, there is no problem if the color filter is used as the light absorption film 46. As the order of manufacturing, a color filter as the light absorption film 46 is formed on the light shielding film 44 of the phase detection pixel 2B and is subjected to the reflow processing, and then the R, G, and B color filters 45 may just be formed on the imaging pixel 2A.

It is desirable that the light absorption film 46 is arranged in a position as close to the light shielding film 44 as possible. This is because the light to be shielded to be incident on the light shielding film 44, and the light to be incident on the light absorption film 46 coincide more. Therefore, like the above-described plurality of embodiments, an embodiment in which the light absorption film 46 is formed immediately above the light shielding film 44 is most desirable.

Figure 14:
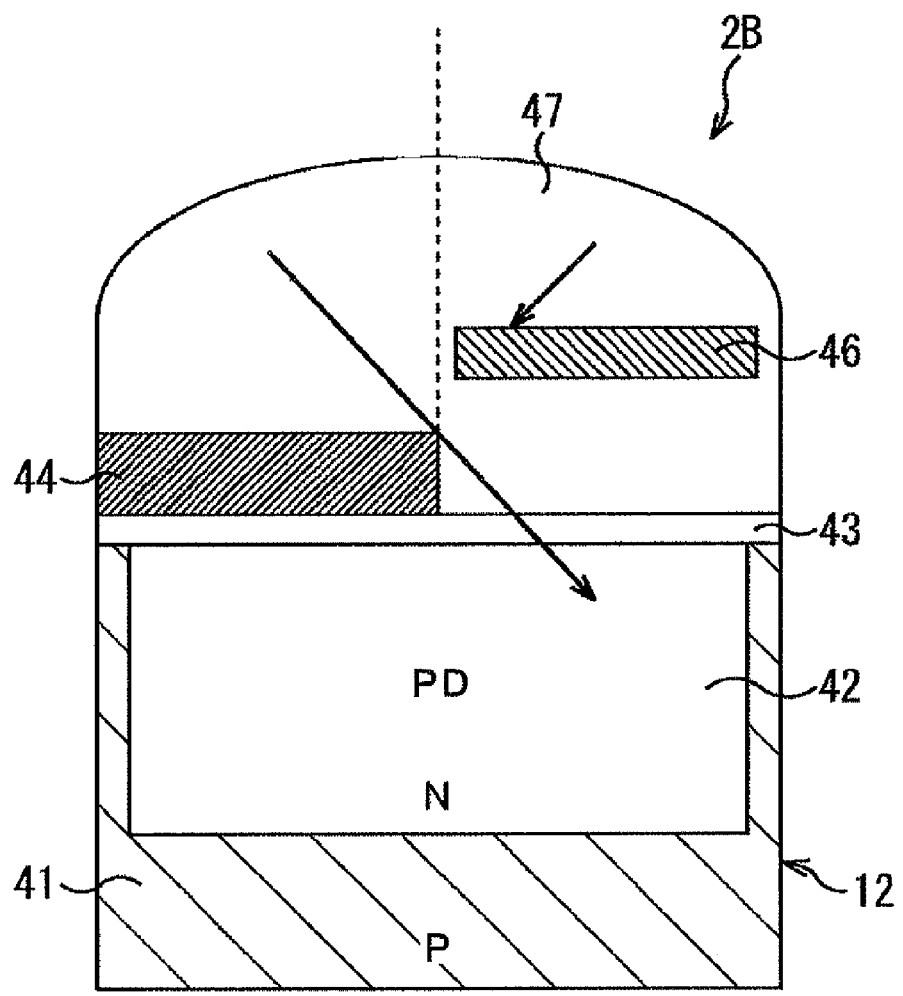
FIG. 14 is a diagram describing a configuration of a phase detection pixel according to the present disclosure.

However, the arrangement position of the light absorption film 46 is not necessarily limited only to the embodiment of arranging immediately above the light shielding film 44. For example, as illustrated in FIG. 14, the light absorption film 46 may not be arranged immediately above the light shielding film 44. In other words, the light absorption film 46 may just not exist on an optical axis of light to be incident on the photodiode PD, and may just exist on an optical axis of light to be incident on the light shielding film 44.

Note that a film of $SiO_2$, SIN, or the like may be inserted between the light shielding film 44 and the light absorption film 46 for the purpose of improvement of adhesiveness of a metal film and a color filter, or a barrier layer. In this case, it is favorable to cause the light shielding film 44 and the light absorption film 46 to close each other such that the distance between the light shielding film 44 and the light absorption film 46 is 300 nm or less than 300 nm, for example.

<5. Seventh to Ninth Embodiments of a Phase Detection Pixel>

Figure 15:
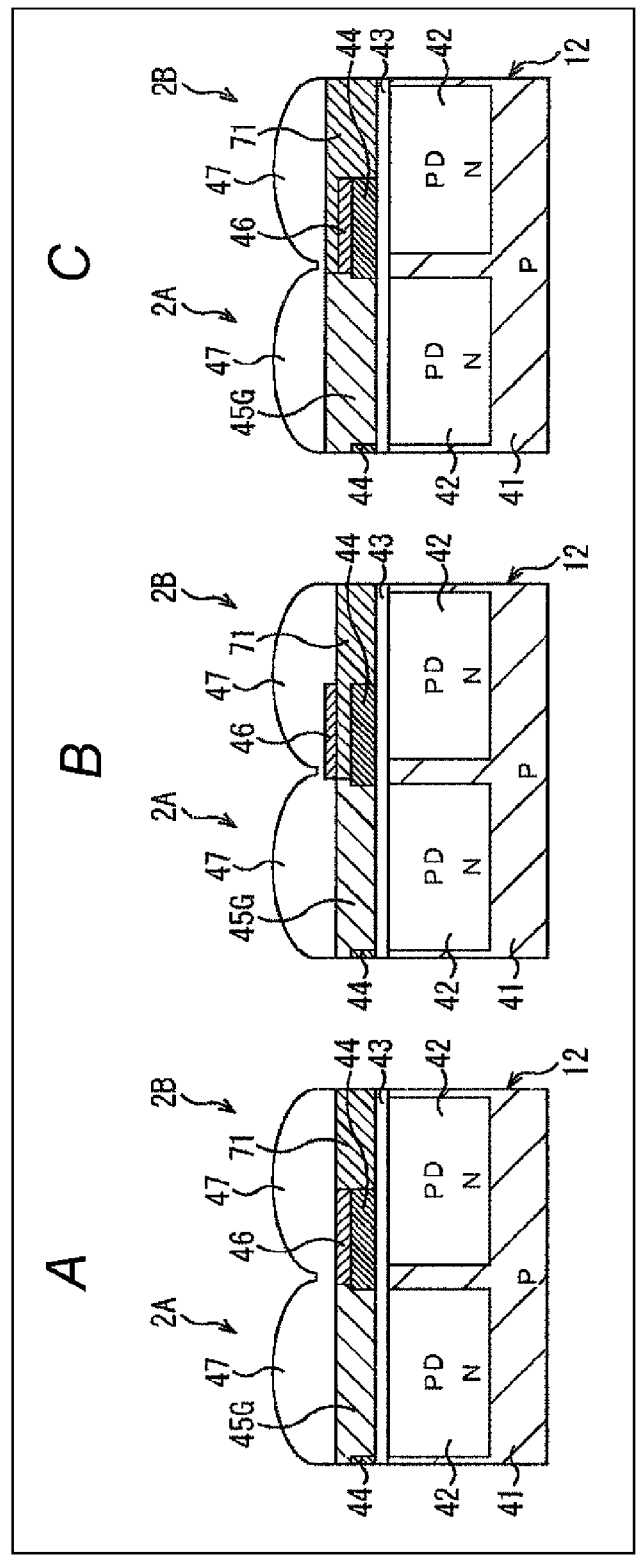
FIGS. 15A to 15C are diagrams illustrating seventh to ninth embodiments of a phase detection pixel.

FIGS. 15A to 15C illustrate seventh to ninth embodiments of a phase detection pixel 2B.

In the above-described embodiments, cases in which the phase detection pixel 2B receives light of the entire wavelength, and detects a phase difference have been described. In other words, cases in which a portion corresponding to the color filter 45 of the imaging pixel 2A is filled with a transparent material of the on-chip lens 47, or the white filter 61 is formed have been described.

However, the phase detection pixel 2B may receive light having a specific wavelength, such as green, and detect the phase difference, rather than receiving the light of the entire wavelength and detecting the phase difference.

The phase detection pixels 2B of FIGS. 15A to 15C illustrate pixel structures in which a green color filter 71 is arranged, instead of the white filter 61 of the phase detection pixel 2B illustrated in FIGS. 7A to 7C.

The color filter 71 formed on the optical axis of light to be transmitted, which is incident on the photodiode PD of the phase detection pixel 2B is a filter having a different color from the color filter as the light absorption film 46 formed on the optical axis of light to be shielded, which is incident on the light shielding film 44.

In the examples of FIGS. 15A to 15C, the light absorption film 46 is formed of a blue color filter, and the color filter 71 formed on the optical axis of light to be transmitted is a green filter. However, the combination of the colors is not limited to the example.

<6. An Example of Exit Pupil Correction of a Solid State Image Sensor>

The solid state image sensor 1 may be configured to perform exit pupil correction.

A configuration of the pixel array unit 3 that performs exit pupil correction will be described with reference to FIG. 16 and FIGS. 17A and 17B.

Figure 16:
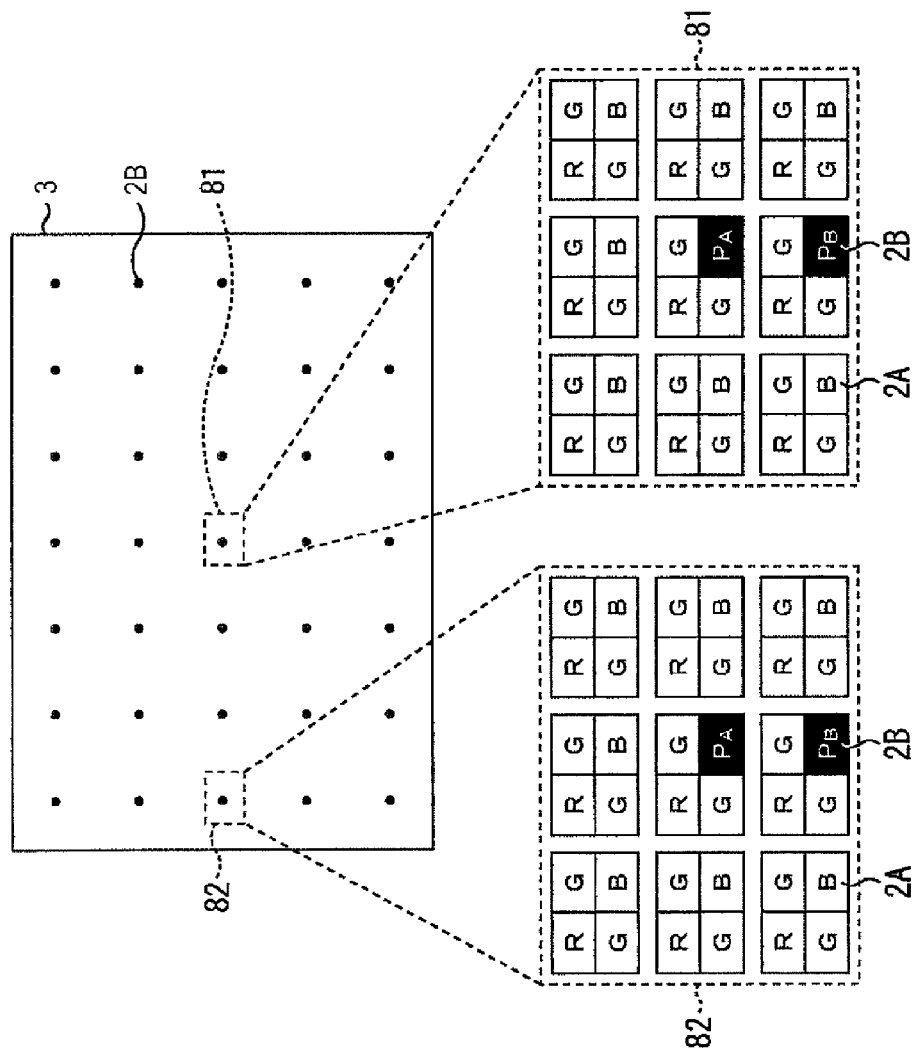
FIG. 16 is a diagram describing a configuration of a pixel array unit that has performed exit pupil correction.
Figure 17:
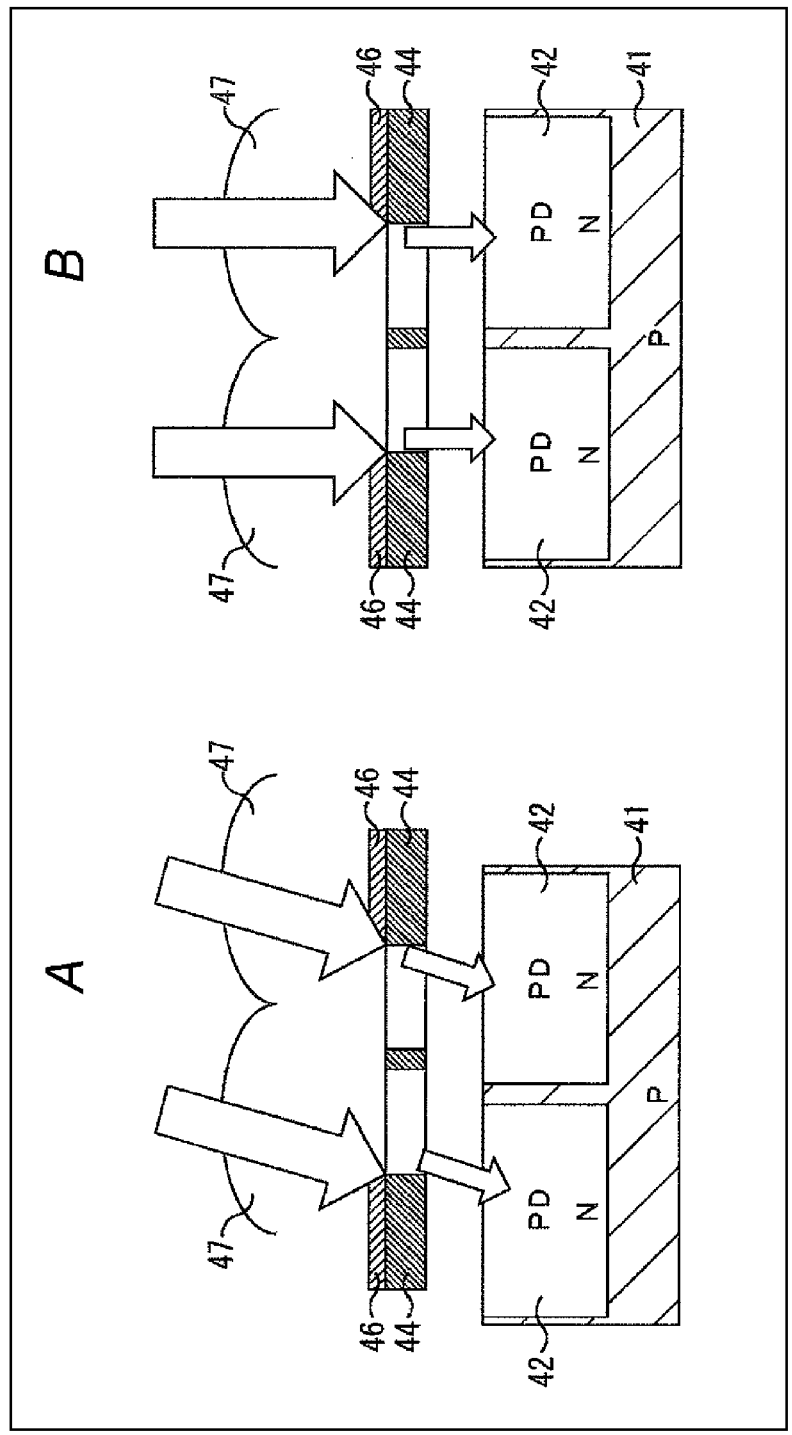
FIGS. 17A and 17B are diagrams describing a configuration of a pixel array unit that has performed exit pupil correction.

Among the phase detection pixels 2B arranged in the pixel array unit 3 illustrated in FIG. 16, structures of the phase detection pixel 2B in a region 81 of a central portion of the pixel array unit 3, and of the phase detection pixel 2B in a region 82 of a peripheral portion of the pixel array unit 3 are illustrated in FIGS. 17A and 17B.

FIG. 17A illustrates the structure of the phase detection pixel 2B in the region 82 of the peripheral portion of the pixel array unit 3, and FIG. 17B illustrates the structure of the phase detection pixel 2B in the region 81 of the central portion of the pixel array unit 3.

Note that a pair of the phase detection pixels 2B displayed in FIG. 16 as "$P_A$" and "$P_B$" is illustrated side by side in FIGS. 17A and 17B for convenience.

In the region 81 of the central portion of the pixel array unit 3, an incident angle of a main light beam of the incident light through an optical lens (not illustrated) becomes 0 degrees, and thus the exit pupil correction is not performed. That is, as illustrated in FIG. 17B, the optical center of the on-chip lens 47 of the phase detection pixel 2B is arranged to coincide with the center of the photodiode PD.

Meanwhile, in the region 82 of the peripheral portion of the pixel array unit 3, the incident angle of the main light beam of the incident light through the optical lens becomes a predetermined angle according to a design of the lens, and thus the exit pupil correction is performed. That is, as illustrated in FIG. 17A, the optical center of the on-chip lens 47 of the phase detection pixel 2B is arranged to be shifted to a center side of the pixel array unit 3 from the center of the photodiode PD.

Note that, while only the relationship between the optical center of the on-chip lens 47 and the center of the photodiode PD has been described, the light shielding film 44 and the light absorption film 46 are arranged to be shifted according to the inclination of the main light beam of the incident light in a similar manner. Further, as described above, the offset amount y between the light shielding film 44 and the light absorption film 46 differs according to the pixel position in the pixel array unit 3.

<7. Arrangement Examples of a Light Shielding Film>

Figure 18:
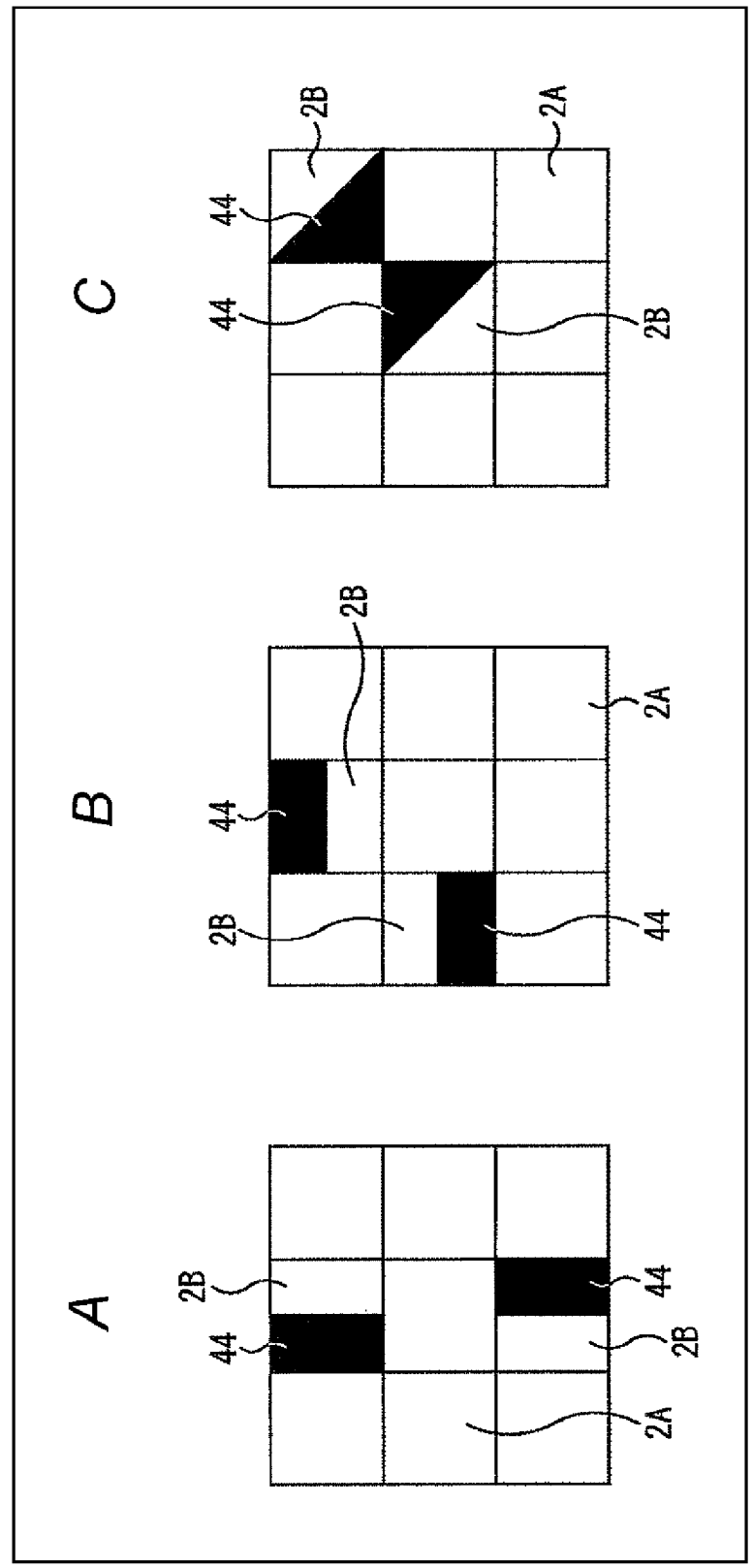
FIGS. 18A to 18C are diagrams illustrating arrangement examples of the light shielding film.

FIGS. 18A to 18C are diagrams illustrating arrangement examples of the light shielding film 44 in the phase detection pixel 2B.

In the above-described embodiments, examples of the phase detection pixel 2B where the light shielding direction is the right and left direction (horizontal direction) have been described. To be specific, as illustrated in FIG. 18A, an example in which a pair of the phase detection pixels 2B is configured from the type A in which the light shielding film 44 is arranged in the right-side half portion, and the type B in which the light shielding film 44 is arranged in the left-side half portion has been described.

However, the light shielding direction of the light shielding film 44 is not limited to the examples.

For example, the technology of the present disclosure is applicable to the phase detection pixel 2B where the light shielding direction is an up and down direction (vertical direction). In the phase detection pixel 2B where the light shielding direction is the up and down direction, as illustrated in FIG. 18B, a pair of phase detection pixels 2B is configured from a type A in which the light shielding film 44 is arranged in an upper side half portion, and a type B in which the light shielding film 44 is arranged in a lower side half portion.

Further, the technology of the present disclosure is applicable to the phase detection pixel 2B where the light shielding direction is a diagonal direction. In the phase detection pixel 2B where the light shielding direction is a diagonal direction, as illustrated in FIG. 18C, a pair of the phase detection pixels 2B is configured from a type A in which the light shielding film 44 is formed in an upper right half portion, and a type B in which the light shielding film 44 is arranged in a lower left half portion. Alternatively, the pair of the phase detection pixels 2B may be configured from a type A in which light shielding film 44 is arranged in a lower right half portion, and a type B in which the light shielding film 44 is arranged in an upper left half portion.

Further, the phase detection pixels 2B of FIGS. 18A to 18C may be mixed in the pixel array unit 3.

<8. An Application Example to an Electronic Device>

Application of the technology of the present disclosure is not limited to a solid state image sensor. That is, the technology of the present disclosure may be applied to any electronic device that uses a solid state image sensor in an image taking-in unit (photoelectric conversion unit) in general, such as an imaging device including a digital still camera or a video camera, a mobile terminal such as a smart phone having an imaging function (multifunction mobile phone), or a copying machine using a solid state image sensor in an image reading unit. The solid state image sensor may be formed into one chip, or may be formed into a module having an imaging function, in which an imaging unit and a signal processing unit or an optical system are packaged together.

<A Configuration Example of an Imaging Device>

Figure 19:
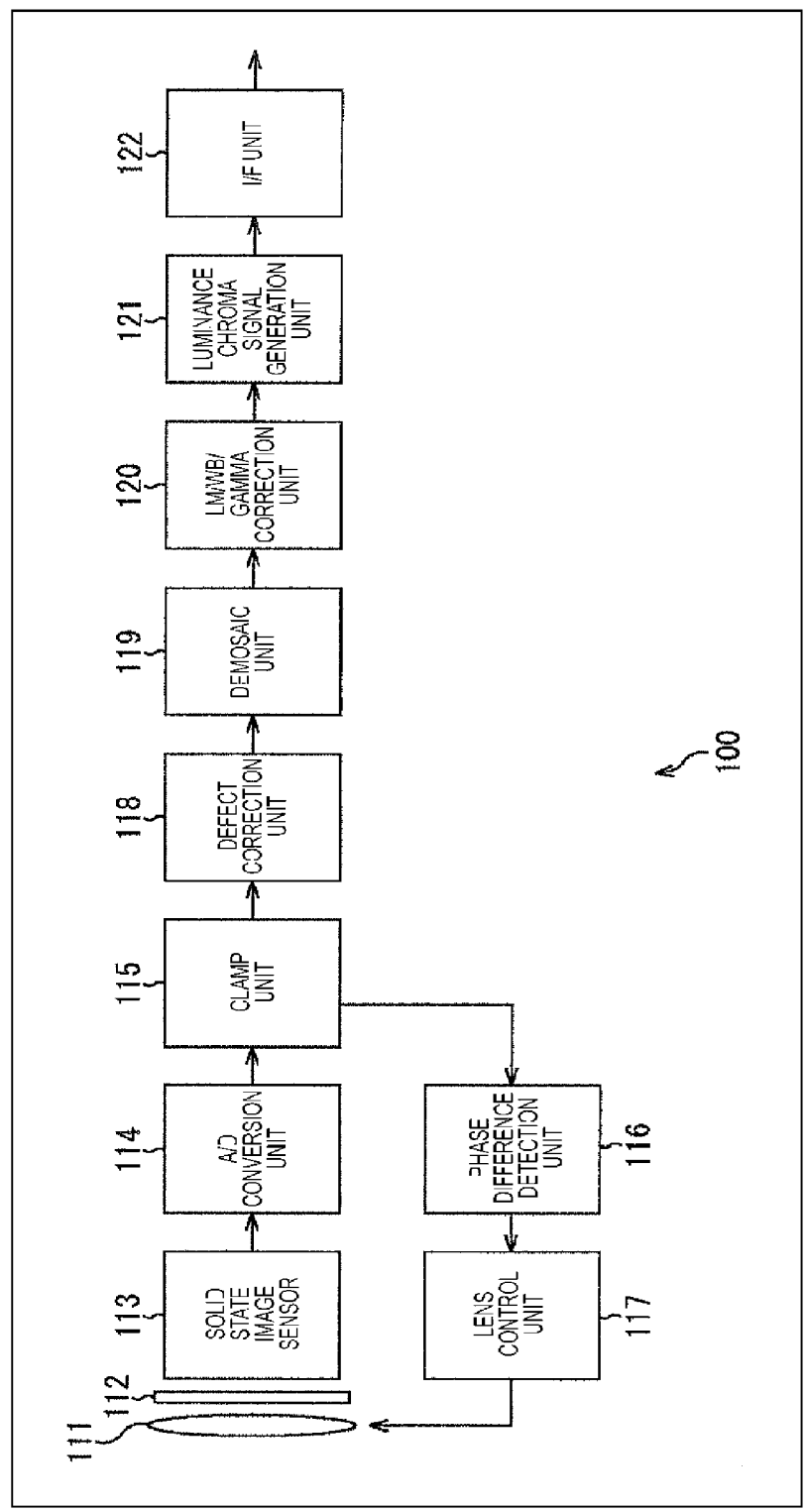
FIG. 19 is a block diagram illustrating a configuration example of an imaging device according to the present disclosure.

FIG. 19 is a block diagram illustrating a configuration example of an imaging device on which the solid state image sensor of the present disclosure is incorporated.

An imaging device 100 illustrated in FIG. 19 is configured from an optical lens 111, an optical filter 112, a solid state image sensor 113, an A/D conversion unit 114, a clamp unit 115, a phase difference detection unit 116, a lens control unit 117, a defect correction unit 118, a demosaic unit 119, a linear matrix (LM)/white balance (WB)/gamma correction unit 120, a luminance chroma signal generation unit 121, and an interface (I/F) unit 122.

The optical lens 111 adjusts a focal distance of object light incident on the solid state image sensor 113. At a later step of the optical lens 111, a diaphragm (not illustrated) that adjusts a light amount of the object light incident on the solid state image sensor 113 is provided. A specific configuration of the optical lens 111 is arbitrarily determined, and for example, the optical lens 111 may be configured from a plurality of lenses.

The object light transmitted via the optical lens 111 is incident on the solid state image sensor 113 through the optical filter 112 configured as an IR cut filter that transmits light other than infrared light.

The solid state image sensor 113 converts the object light into an electrical signal in pixel units, and supplies the electrical signal to the A/D conversion unit 114. The configuration of the solid state image sensor 1 is employed for the solid state image sensor 113.

That is, the solid state image sensor 113 includes the pixel array unit 3 in which the imaging pixel 2A and the phase detection pixel 2B are mixed, and the phase detection pixel 2B has a configuration in which the light absorption film 46 is provided on the optical axis of light to be shielded, which is incident on the light shielding film 44, and the light absorption film 46 is not provided on the optical axis of light to be transmitted, which is incident on the photodiode PD.

Accordingly, unnecessary reflection by the light shielding film 44 can be suppressed in the phase detection pixel 2B, and thus the risk of occurrence of a flare or a red-ball ghost can be decreased. Further, the AF control accuracy and the focusing speed can be improved, and the high image quality of a captured image can be achieved.

The A/D conversion unit 114 converts an electrical signal (analog signal) of RGB supplied from the solid state image sensor 113 into digital data (pixel data). The A/D conversion unit 114 supplies the digital pixel data (raw data) to the clamp unit 115.

The clamp unit 115 subtracts a black level that is a level determined to be black from the pixel data output from the A/D conversion unit 114. Then the clamp unit 115 outputs pixel data of the imaging pixel 2A from among pixel data (pixel value) after subtraction of the black level to the defect correction unit 118, and outputs the pixel data of the phase detection pixel 2B to the phase difference detection unit 116.

The phase difference detection unit 116 determines whether an object to be focused (object to be focused) is focused by performing phase difference detection processing based on the pixel data from the clamp unit 115. When the object in a focus area is focused, the phase difference detection unit 116 supplies information indicating the object is focused to the lens control unit 117 as a focus determination result. Further, when the object to be focused is not focused, the phase difference detection unit 116 calculates a deviation amount of focus (defocus amount), and supplies information indicating the calculated defocus amount to the lens control unit 117 as a focus determination result.

The lens control unit 117 controls driving of the optical lens 111. To be specific, the lens control unit 117 calculates a driving amount of the optical lens 111 based on the focus determination result supplied from the phase difference detection unit 116, and moves the optical lens 111 according to the calculated driving amount.

The defect correction unit 118 corrects pixel data of a defect pixel. That is, only the pixel data of the imaging pixel 2A is supplied from the clamp unit 115 to the defect correction unit 118, and thus the phase detection pixel 2B is determined as a defect pixel. The defect correction unit 118 performs processing of correcting the pixel data in the pixel position of the phase detection pixel 2B based on the pixel data of the peripheral imaging pixel 2A. In the correction processing in the defect correction unit 118, the configuration of the solid state image sensor 1 described as the solid state image sensor 113 has been employed. Therefore, the color mixture to the adjacent imaging pixel 2A is suppressed, and defect correction accuracy is improved. The defect correction unit 118 supplies pixel data corresponding to all of the pixels after defect pixel correction processing to the demosaic unit 119.

The demosaic unit 119 performs demosaic processing with respect to the pixel data from the defect correction unit 118, and performs supplement of color information and the like and converts the pixel data into RGB data. The demosaic unit 119 supplies image data after the demosaic processing to the LM/WB/gamma correction unit 120.

The LM/WB/gamma correction unit 120 corrects color characteristics of the image data from the demosaic unit 119. To be specific, the LM/WB/gamma correction unit 120 performs processing of correcting color signals of image data using a matrix co-efficient, and changing the color reproducibility in order to fill a gap between a chromaticity point of the primary colors (RGB) defined in a standard, and a chromaticity point of an actual camera. Further, the LM/WB/gamma correction unit 120 adjusts a white balance by setting a gain to white about values of channels of the image data. Further, the LM/WB/gamma correction unit 120 performs gamma correction to obtain a display closer to an original by adjusting a relative relationship between the colors of the image data and output device characteristics. LM/WB/gamma correction unit 120 supplies corrected image data to the luminance chroma signal generation unit 121.

The luminance chroma signal generation unit 121 generates luminance signal (Y) and a color difference signal (Cr, Cb) from the image data supplied from the LM/WB/gamma correction unit 120. When having generated a luminance chroma signal (Y, Cr, Cb), the luminance chroma signal generation unit 121 supplies the luminance signal and the color difference signal to the I/F unit 122.

The I/F unit 122 outputs the supplied image data (luminance chroma signal) to an outside of the imaging device 100 (for example, a storage device that stores image data, a display device that displays an image of the image data, or the like).

Figure 20:
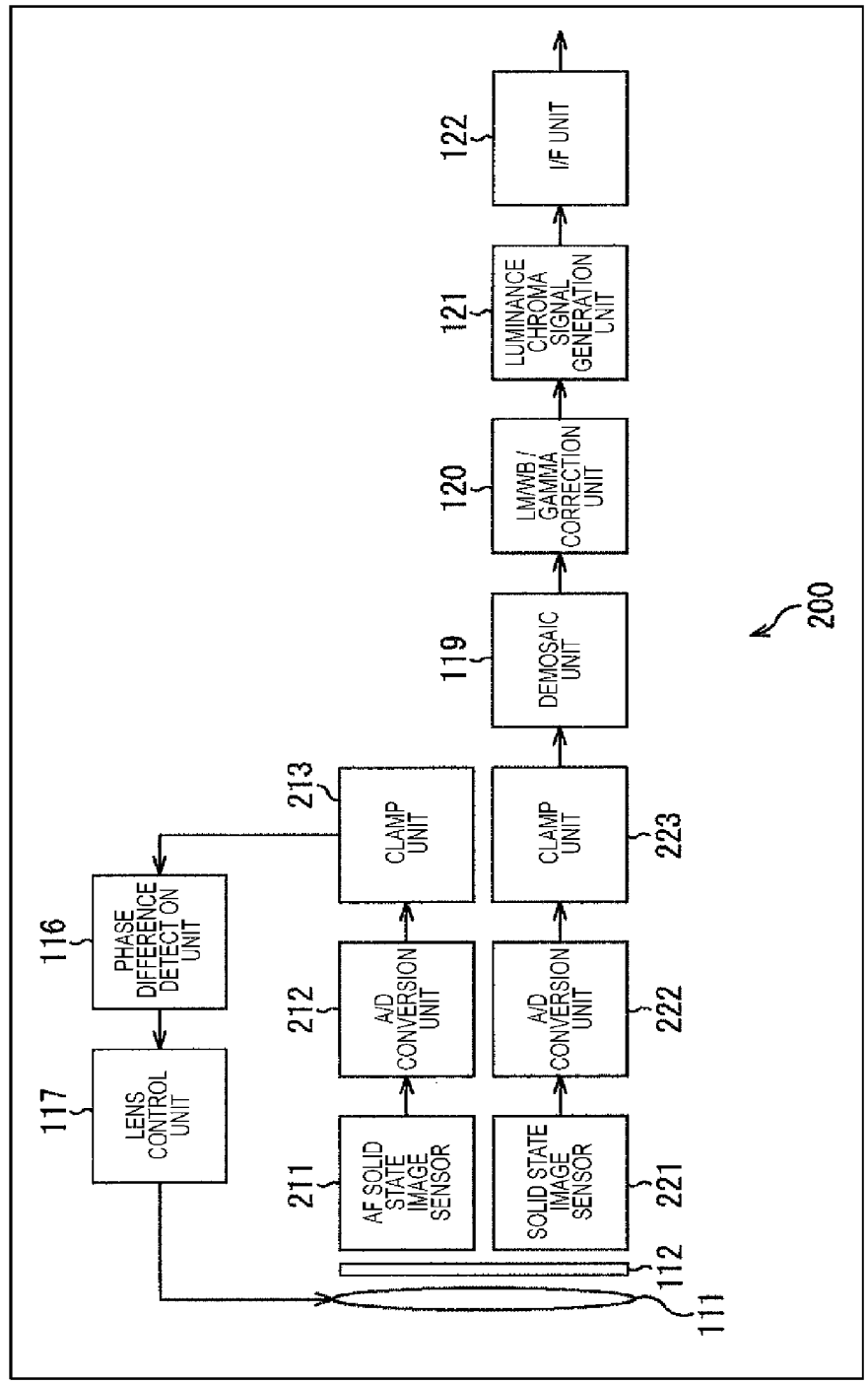
FIG. 20 is a block diagram illustrating another configuration example of the imaging device according to the present disclosure.

FIG. 20 is a block diagram illustrating another configuration example of the imaging device.

Note that, in FIG. 20, portions corresponding to FIG. 19 are denoted with the same reference signs, and description thereof is appropriately omitted.

An imaging device 200 illustrated in FIG. 20 is configured from an optical lens 111, an optical filter 112, an AF solid state image sensor 211, an A/D conversion unit 212, a clamp unit 213, a phase difference detection unit 116, a lens control unit 117, a solid state image sensor 221, an A/D conversion unit 222, a clamp unit 223, a demosaic unit 119, an LM/WB/gamma correction unit 120, a luminance chroma signal generation unit 121, and an I/F unit 122.

That is, in the imaging device 200 of FIG. 20, the AF solid state image sensor 211 configured from only a plurality of phase detection pixels 2B, and the solid state image sensor 221 configured from only a plurality of imaging pixels 2A are provided, and generation of an AF pixel signal and generation of an image generation pixel signal are in separate systems.

To be specific, the AF solid state image sensor 211 supplies an electrical signal obtained by photoelectric conversion in the phase detection pixel 2B to the A/D conversion unit 212. The A/D conversion unit 212 converts the electrical signal of an analog signal supplied from the AF solid state image sensor 211 into a digital pixel signal, and supplies the signal to the clamp unit 213. The clamp unit 213 subtracts the black level from the pixel data output from the A/D conversion unit 212, and outputs pixel data (pixel value) after the black level subtraction to the phase difference detection unit 116.

Meanwhile, the solid state image sensor 221 supplies an electrical signal obtained by photoelectric conversion in the imaging pixel 2A to the A/D conversion unit 222. The A/D conversion unit 222 converts the electrical signal of an analog signal supplied from the solid state image sensor 221 into a digital pixel signal, and outputs the signal to the clamp unit 223. The clamp unit 223 subtracts the black level from the pixel data output from the A/D conversion unit 222, and outputs pixel data (pixel value) after the black level subtraction to the demosaic unit 119.

In the imaging device 200, the defect correction unit 118 of FIG. 19 is omitted.

Even in the imaging device 200 having the above configuration, the AF solid state image sensor 211 includes the phase detection pixel 2B of the present disclosure, thereby suppressing unnecessary reflection by the light shielding film 44 and incidence of unnecessary signals to the adjacent pixel (phase detection pixel 2B), and thus the phase difference detection accuracy can be improved. Further, the AF control accuracy and the focusing speed can be improved, and the high image quality of a captured image can be achieved.

<A Configuration Example of a Substrate>

Figure 21:
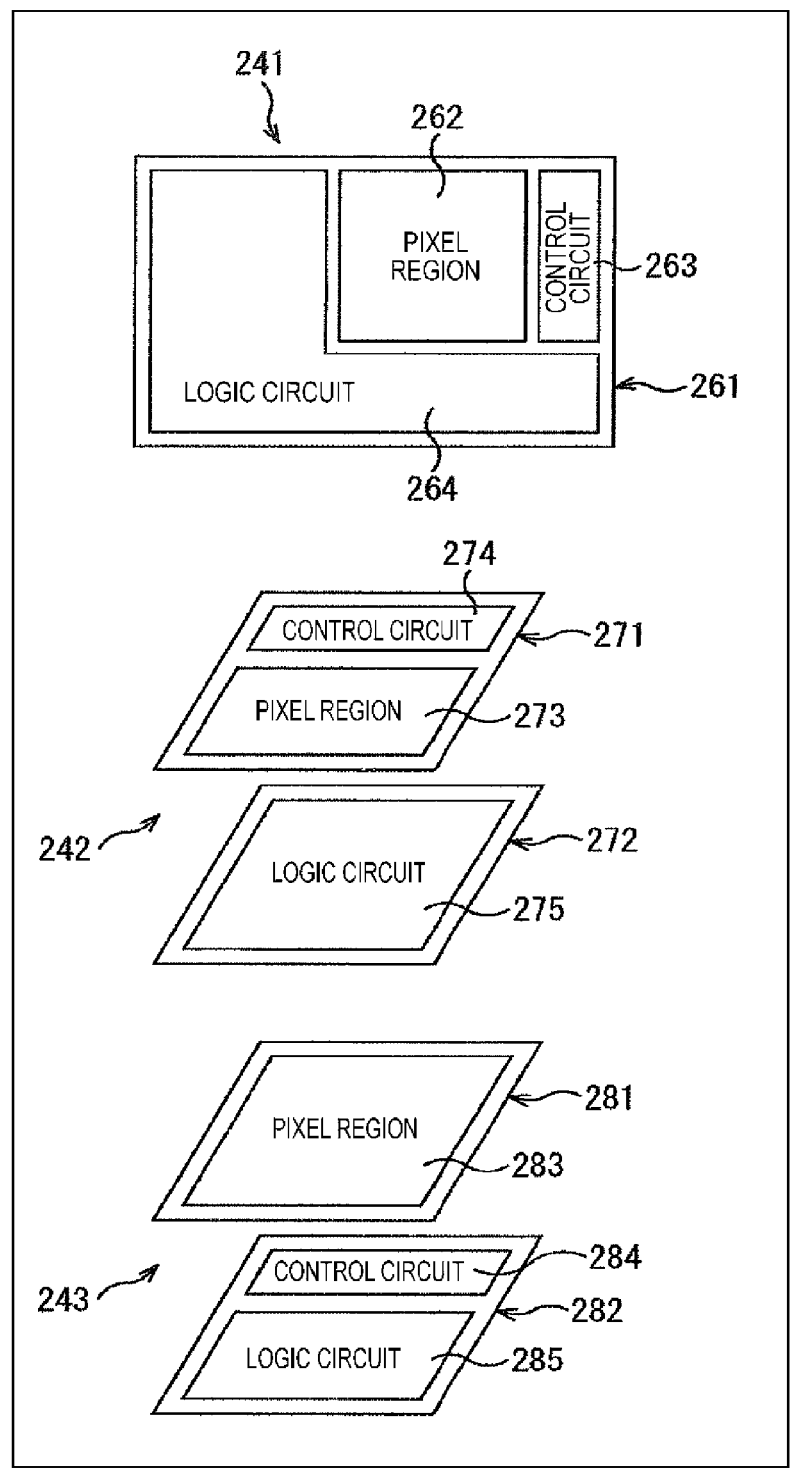
FIG. 21 is a diagram illustrating a basic configuration example of the solid state image sensor according to the present disclosure.

The above-described solid state image sensor 113 and the AF solid state image sensor 211 can be configured from a substrate configuration from solid state image sensors 241 to 243 illustrated in FIG. 21.

The solid state image sensor 241 illustrated in the upper section of FIG. 21 incorporates a pixel region 262, a control circuit 263, and a logic circuit 264 that includes a signal processing circuit in one semiconductor chip 261.

The solid state image sensor 242 illustrated in the middle section of FIG. 21 is configured from a first semiconductor chip unit 271 and a second semiconductor chip unit 272. In the first semiconductor chip unit 271, a pixel region 273 and a control circuit 274 are incorporated, and in the second semiconductor chip unit 272, a logic circuit 275 including a signal processing circuit is incorporated. Then, the first semiconductor chip unit 271 and the second semiconductor chip unit 272 are mutually electrically connected, so that the solid state image sensor 242 as a single semiconductor chip is configured.

The solid state image sensor 243 illustrated in the lower section of FIG. 21 is configured from a first semiconductor chip unit 281 and a second semiconductor chip unit 282. In the first semiconductor chip unit 281, a pixel region 283 is incorporated, and in the second semiconductor chip unit 282, a control circuit 284 and a logic circuit 285 including a signal processing circuit are incorporated. Then, the first semiconductor chip unit 281 and the second semiconductor chip unit 282 are mutually electrically connected, so that the solid state image sensor 243 is configured as a single semiconductor chip.

<An Example of a Configuration of a Digital Single-lens Reflex Camera>

Figure 22:
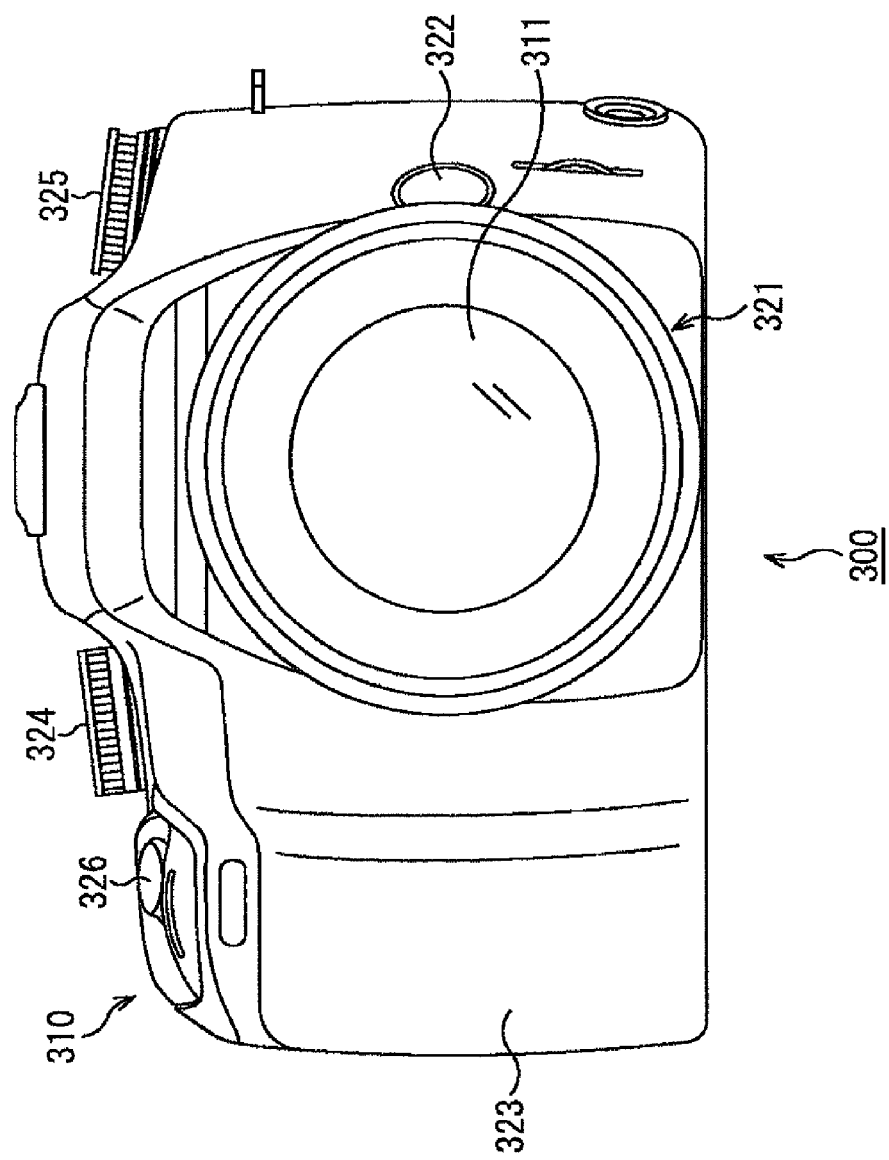
FIG. 22 is a front view illustrating an example of a configuration of a digital single-lens reflex camera as the imaging device according to the present disclosure.

FIG. 22 is a front view illustrating an example of a configuration of a digital single-lens reflex camera as an example of an imaging device of the present disclosure.

A digital single-lens reflex camera 300 (hereinafter, simply referred to as camera 300) includes a camera body 310 and an interchangeable lens 311 detachable/attachable from/to the camera body 310.

In FIG. 22, in a front side of the camera body 310, a mount unit 321 to which the interchangeable lens 311 is mounted in an approximately center of the front, a lens exchange button 322 arranged at a right side of the mount unit 321, and a grip unit 323 that enables to the camera to be held are provided.

Further, at an upper surface side of the camera body 310, a mode setting dial 324 arranged at an upper left portion of the front, a control value setting dial 325 arranged at an upper right portion of the front, and a shutter button 326 arranged at an upper surface of the grip unit 323 are provided.

Further, although not illustrated, a liquid crystal display (LCD), various buttons and keys, electronic view finder (EVF), and the like are provided at a back surface side of the camera body 310.

<An Example of an Application to a Capsule Endoscope>

Figure 23:
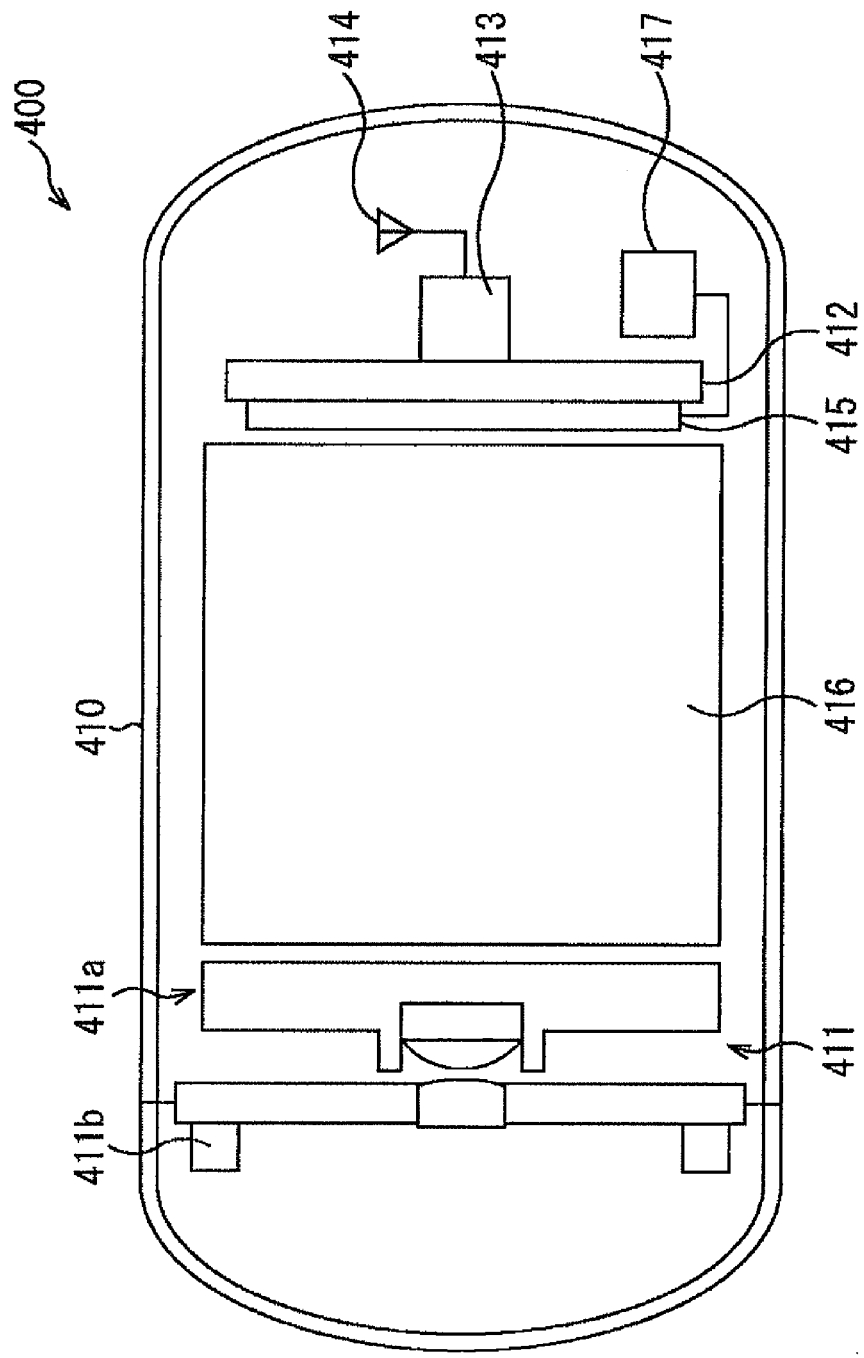
FIG. 23 is a diagram illustrating a cross sectional configuration of a capsule endoscope in which the solid state image sensor of the present disclosure is incorporated.

FIG. 23 is a diagram illustrating a cross sectional configuration of a capsule endoscope in which the solid state image sensor of the present disclosure is incorporated.

A capsule endoscope 400 includes, in a casing 410 having semispherical both end surfaces and a cylindrical central portion, a camera (microminiature camera) 411 for imaging an image of a body cavity, a memory 412 for recording image data imaged by the camera 411, and a radio transmitter 413 for transmitting the recorded image data to an outside through an antenna 414 after the capsule endoscope 400 is discharged outside the body of a subject.

Further, a central processing unit (CPU) 415 and a coil (magnetic force/current exchange coil) 416 are provided in the casing 410.

The CPU 415 controls capturing of an image by the camera 411 and a data accumulation operation to the memory 412, and controls data transmission from the memory 412 to a data reception device (not illustrated) outside the casing 410 by the radio transmitter 413. The coil 416 supplies power to the camera 411, the memory 412, the radio transmitter 413, the antenna 414, and to a light source 411b described below.

Further, a lead (magnetic) switch 417 for detecting setting of the capsule endoscope 400 to the data reception device is provided in the casing 410. At a timing when this lead switch 417 detects the setting to the data reception device and data transmission is enabled, the power supply from the coil 416 to the radio transmitter 413 is started.

The camera 411 includes a solid state image sensor 411a including an objective optical system for capturing an image inside the body cavity, and a plurality of (here, two) light sources 411b for illuminating inside the body cavity. The above-described configuration of the solid state image sensor 1 is employed for the solid state image sensor 411a, and the light source 411b is configured from a light emitting diode (LED), for example.

<An Appearance Configuration of a Smart Phone>

Figure 24:
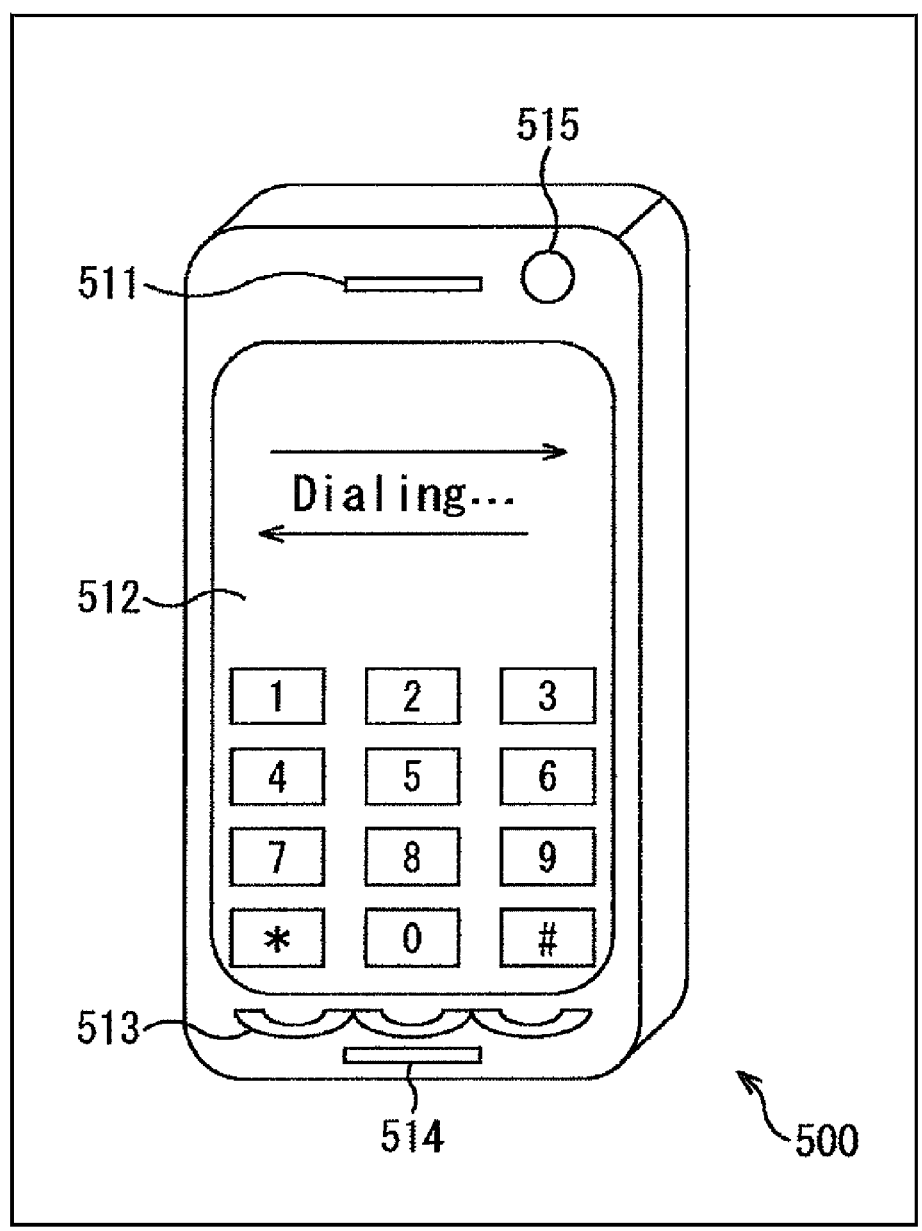
FIG. 24 is a diagram illustrating an example of a configuration of a smart phone including the solid state image sensor of the present disclosure.

FIG. 24 is a diagram illustrating an example of a configuration of a smart phone including a solid state image sensor of the present disclosure.

A smart phone 500 includes a speaker 511, a display 512, an operation button 513, a microphone 514, an imaging unit 515, and the like.

When a telephone function is executed in the smart phone 500, a transmitting voice acquired from the microphone 514 is transmitted to a base station through a communication unit (not illustrated), and a receiving voice from the other end of the line is supplied from the communication unit to the speaker 511 and a sound is reproduced.

The display 512 is made of a liquid crystal display (LCD) for example, and displays a predetermined screen such as a standby screen for a telephone call. A touch panel is superimposed on the display 512, and can detect an operation input by a finger of the user to the display 512. The smart phone 500 can execute predetermined processing, for example, an application, according to the detected operation input by the user.

The imaging unit 515 is made of a solid state image sensor, an optical lens, and the like, and images a subject based on the operation input by the user, and stores imaged image data of the subject in the memory, and the like. By employing the above-described configuration of the solid state image sensor 1 as the solid state image sensor of the imaging unit 515, a pixel signal in which unnecessary reflection to an adjacent pixel is suppressed can be generated, and high image quality of a captured image can be achieved.

An embodiment of the present disclosure is not limited to the above-described embodiments, and various modifications can be made within a scope without departing from the gist of the present disclosure.

For example, in the above-described example, the signal output from the phase detection pixel 2B is used for control of auto focus. However, the signal can be used for depth information in a depth detection sensor or a 3D sensor other than the use for the control of auto focus.

In the above-described example, the solid state image sensor in which the first conductive type is a P type, and the second conductive type is an N type, and the electrons are signal charges has been described. However, the technology of the present disclosure can be applied to a solid state image sensor in which a positive hole is a signal charge. That is, the above semiconductor regions can be configured from reversed conductive type semiconductor regions where the first conductive type is the N type, and the second conductive type is the P type.

Further, the technology of the present disclosure can be applied not only to the solid state image sensor that detects an incident amount of visible light and images the light as an image, but also to a solid state image sensor that images distribution of an incident amount of an infrared ray, an X ray, or particles as an image, or a solid state image sensor (physical amount distribution detection device) such as a fingerprint detection sensor that detects distribution of another physical amount in a board sense, such as a pressure or an electrostatic capacity, and images the distribution as an image, in general.

Note that the present disclosure may employ the following configurations.

(1)

A solid state image sensor including: a phase detection pixel in which a light receiving surface of a photoelectric conversion element is shielded larger than an imaging pixel by a light shielding film, wherein the phase detection pixel includes a light absorption film on an optical axis of light to be shielded, which is incident on the light shielding film, and the light absorption film is not provided on an optical axis of light to be transmitted, which is incident on the light receiving surface.

(2)

The solid state image sensor according to (1), wherein the light absorption film is formed of a predetermined color filter.

(3)

The solid state image sensor according to (1) or (2), wherein the light absorption film is formed of one color filter used in the imaging pixel.

(4)

The solid state image sensor according to any of (1) to (3), wherein the light absorption film is a blue color filter.

(5)

The solid state image sensor according to any of (1) to (4), wherein the light absorption film is formed by stretching a color filter of the adjacent imaging pixel.

(6)

The solid state image sensor according to any of (1) to (5), wherein the light absorption film is configured from a plurality of layered color filters used in the imaging pixel.

(7)

The solid state image sensor according to any of (1) to (5), wherein the light absorption film is an infrared filter or a black color filter.

(8)

The solid state image sensor according to any of (1) to (6), wherein a color filter having a different color from the light absorption film is provided on the optical axis of light to be transmitted, which is incident on the light receiving surface.

(9)

The solid state image sensor according to any of (1) to (8), wherein a white filter is provided on the optical axis of light to be transmitted, which is incident on the light receiving surface.

(10)

The solid state image sensor according to any of (1) to (9), wherein the light absorption film is formed on the light shielding film.

(11)

The solid state image sensor according to any of (1) to (10), wherein a line width of the light absorption film in a light shielding direction is offset to be shorter than the light shielding film.

(12)

The solid state image sensor according to (11), wherein an offset amount of the light absorption film is determined according to a maximum incident angle.

(13)

The solid state image sensor according to (11) or (12), wherein an offset amount of the light absorption film differs according to a position in the pixel array unit.

(14)

The solid state image sensor according to any of (11) to (13), wherein an offset amount of the light absorption film differs according to a height from the light shielding film.

(15)

The solid state image sensor according to any of (1) to (14), wherein the light absorption film is formed on the light shielding film through a predetermined film.

(16)

The solid state image sensor according to any of (1) to (15), wherein the phase detection pixel and the imaging pixel are mixed.

(17)

The solid state image sensor according to any of (1) to (15) configured from only the phase detection pixel.

(18)

The solid state image sensor according to any of (1) to (17), wherein the light shielding film is a metal film.

(19)

A method of manufacturing a solid state image sensor, the method including: forming, in a pixel region of a phase detection pixel, a light shielding film in which a light receiving surface of a photoelectric conversion element is shielded larger than an imaging pixel; and forming a light absorption film on an optical axis of light to be shielded, which is incident on the light shielding film, without forming the light absorption film on an optical axis of light to be transmitted, which is incident on the light receiving surface.

(20)

An electronic device including: a solid state image sensor including a phase detection pixel in which a light receiving surface of a photoelectric conversion element is shielded larger than an imaging pixel by a light shielding film, wherein the phase detection pixel includes a light absorption film on an optical axis of light to be shielded, which is incident on the light shielding film, and the light absorption film is not provided on an optical axis of light to be transmitted, which is incident on the light receiving surface.

(21)

A solid-state imaging device comprising: a phase detection photodiode with a light receiving surface; a light shielding film that covers a part of the light receiving surface of the phase detection photodiode; and a light absorption film disposed over the phase detection photodiode, wherein, the light absorption film is disposed over the light shielding film.

(22)

The solid-state imaging device of claim (21), further comprising: an imaging photodiode having a light receiving surface with a light receiving region that is larger than that of the phase detection photodiode.

(23)

The solid-state imaging device of claim (21), further comprising: an imaging photodiode with a light receiving surface; and a color filter over the imaging photodiode, Wherein, the light absorption film and the color filter comprise a same material.

(24)

The solid-state imaging device of claim (23), wherein: the light absorption film comprises a first film and a second film, the first film comprises the same material as the color filter, and the second film comprises a material that is different from that of the first film.

(25)

The solid-state imaging device of claim (21), further comprising: an antireflection film between the phase detection photodiode and the light absorption film.

(26)

The solid-state imaging device of claim (21), wherein the light absorption film is positioned over the light shielding film with a distance therebetween being equal to 300 nm or less than 300 nm.

(27)

The solid-state imaging device of claim (21), wherein: an edge of the light absorption film is offset from an edge of the light shielding film, and the edge of the light absorption film and the edge of the light shielding film are disposed over the light receiving surface of the phase detection photodiode.

(28)

The solid-state imaging device of claim (21), wherein the solid-state imaging device is configured to perform exit pupil correction.

(29)

An electronic apparatus comprising: a solid-state imaging device including a first phase detection photodiode with a light receiving surface; a first light shielding film that covers a part of the light receiving surface; and a first light absorption film disposed over the first phase detection photodiode, wherein, the first light absorption film is disposed over the first light shielding film.

(30)

The electronic apparatus of claim (29), wherein: the solid-state imaging device includes a second phase detection photodiode with a light receiving surface, a second light shielding film covers a part of the light receiving surface of the second phase detection photodiode, and a second light absorption film is disposed over the second light shielding film and over the second phase detection photodiode.

(31)

The electronic apparatus of claim (30), wherein: the part of the light receiving surface of the first phase detection photodiode that is covered by the first light shielding film and the part of the light receiving surface of the second phase detection photodiode that is covered by the second light shielding film are located at different relative positions of their respective photodiodes.

(32)

The electronic apparatus of claim (31), wherein the different relative positions are different lateral positions, different vertical positions, or different diagonal positions.

(33)

The electronic apparatus of claim (29), further comprising: an optical lens; a lens control unit that controls the optical lens; a phase difference detection module that supplies information to the lens control unit, the information being based on signals received from the first phase detection photodiode and the second phase detection photodiode.

(34)

The electronic apparatus of claim (29), wherein, in plan view, the first light shielding film comprises a rectangular shape or a triangular shape over the first phase detection photodiode.

(35)

The electronic apparatus of claim (29), wherein the solid-state imaging device comprises a stack structure that includes (a) a first semiconductor chip unit having a pixel region with at least the first phase detection photodiode, and (b) a second semiconductor chip unit having a signal processing circuit to process signals from the pixel region of the first semiconductor chip unit.

(36)

The electronic apparatus of claim (29), wherein the electronic apparatus comprises a digital camera that includes the solid-state imaging device, a capsule endoscope that includes the solid-state imaging device, or a mobile phone that includes the solid-state imaging device.

(37)

A method of manufacturing a solid-state imaging device, said method comprising: forming a phase detection photodiode; forming a light shielding film to cover a part of a light receiving surface of the phase detection photodiode; and forming a light absorption film over the phase detection photodiode, wherein, the light absorption film is disposed over the light shielding film.

(38)

The method of claim (37), further comprising: forming an imaging photodiode, the imaging photodiode being adjacent to the phase detection photodiode; and forming a color filter over the imaging photodiode, wherein, the color filter and the light absorption film are formed at the same time.

(39)

The method of claim (37), further comprising: forming an imaging photodiode, the imaging photodiode being adjacent to the phase detection photodiode; and forming an antireflection film over the imaging photodiode and the phase detection photodiode, wherein, the light shielding film is between the antireflection film and the light absorption film.

(40)

The method of claim (37), wherein the light absorption film comprises a blue color filter, a red color filter, a green color filter, an infrared filter, or a photosensitive resin material.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Solid stage image sensor
2 Pixel
2A Imaging pixel
2B Phase detection pixel
3 Pixel array unit
44 Light shielding film
45 Color filter
46 Light absorption film
47 On-chip lens
113 Solid state image sensor
211 AF solid state image sensor
100 and 200 Imaging device

What is claimed is:

1. A solid-state imaging device comprising:
   a phase detection photodiode with a light receiving surface;
   a light shielding film that covers a part of the light receiving surface of the phase detection photodiode; and
   a light absorption film disposed over the phase detection photodiode, wherein, the light absorption film is disposed over the light shielding film.

2. The solid-state imaging device of claim 1, further comprising:
   an imaging photodiode having a light receiving surface with a light receiving region that is larger than that of the phase detection photodiode.

3. The solid-state imaging device of claim 1, further comprising:
   an imaging photodiode with a light receiving surface; and
   a color filter over the imaging photodiode, wherein, the light absorption film and the color filter comprise a same material.

4. The solid-state imaging device of claim 3, wherein:
   the light absorption film comprises a first film and a second film,
   the first film comprises the same material as the color filter, and
   the second film comprises a material that is different from that of the first film.

5. The solid-state imaging device of claim 1, further comprising:
   an antireflection film between the phase detection photodiode and the light absorption film.

6. The solid-state imaging device of claim 1, wherein the light absorption film is positioned over the light shielding film with a distance therebetween being equal to 300 nm or less than 300 nm.

7. The solid-state imaging device of claim 1, wherein:
   an edge of the light absorption film is offset from an edge of the light shielding film, and
   the edge of the light absorption film and the edge of the light shielding film are disposed over the light receiving surface of the phase detection photodiode.

8. The solid-state imaging device of claim 1, wherein the solid-state imaging device is configured to perform exit pupil correction.

9. An electronic apparatus comprising:
a solid-state imaging device including a first phase detection photodiode with a light receiving surface;
a first light shielding film that covers a part of the light receiving surface; and
a first light absorption film disposed over the first phase detection photodiode, wherein, the first light absorption film is disposed over the first light shielding film.

10. The electronic apparatus of claim 9, wherein:
the solid-state imaging device includes a second phase detection photodiode with a light receiving surface,
a second light shielding film covers a part of the light receiving surface of the second phase detection photodiode, and
a second light absorption film is disposed over the second light shielding film and over the second phase detection photodiode.

11. The electronic apparatus of claim 10, wherein:
the part of the light receiving surface of the first phase detection photodiode that is covered by the first light shielding film and the part of the light receiving surface of the second phase detection photodiode that is covered by the second light shielding film are located at different relative positions of their respective photodiodes.

12. The electronic apparatus of claim 11, wherein the different relative positions are different lateral positions, different vertical positions, or different diagonal positions.

13. The electronic apparatus of claim 10, further comprising:
an optical lens;
a lens control unit that controls the optical lens;
a phase difference detection module that supplies information to the lens control unit, the information being based on signals received from the first phase detection photodiode and the second phase detection photodiode.

14. The electronic apparatus of claim 9, wherein, in plan view, the first light shielding film comprises a rectangular shape or a triangular shape over the first phase detection photodiode.

15. The electronic apparatus of claim 9, wherein the solid-state imaging device comprises a stack structure that includes (a) a first semiconductor chip unit having a pixel region with at least the first phase detection photodiode, and (b) a second semiconductor chip unit having a signal processing circuit to process signals from the pixel region of the first semiconductor chip unit.

16. The electronic apparatus of claim 9, wherein the electronic apparatus comprises a digital camera that includes the solid-state imaging device, a capsule endoscope that includes the solid-state imaging device, or a mobile phone that includes the solid-state imaging device.

17. A method of manufacturing a solid-state imaging device, said method comprising:
forming a phase detection photodiode;
forming a light shielding film to cover a part of a light receiving surface of the phase detection photodiode; and
forming a light absorption film over the phase detection photodiode, wherein, the light absorption film is disposed over the light shielding film.

18. The method of claim 17, further comprising:
forming an imaging photodiode, the imaging photodiode being adjacent to the phase detection photodiode; and
forming a color filter over the imaging photodiode, wherein, the color filter and the light absorption film are formed at the same time.

19. The method of claim 17, further comprising:
forming an imaging photodiode, the imaging photodiode being adjacent to the phase detection photodiode; and
forming an antireflection film over the imaging photodiode and the phase detection photodiode, wherein, the light shielding film is between the antireflection film and the light absorption film.

20. The method of claim 17, wherein the light absorption film comprises a blue color filter, a red color filter, a green color filter, an infrared filter, or a photosensitive resin material.

* * * * *